(12) United States Patent
Park et al.

(10) Patent No.: US 12,207,456 B2
(45) Date of Patent: Jan. 21, 2025

(54) METHOD OF FORMING AN INTEGRATED CIRCUIT DEVICES HAVING BURIED WORD LINES

(71) Applicant: Samsung Electronics Co., Ltd., Suwon-si (KR)

(72) Inventors: Taejin Park, Yongin-si (KR); Taehoon Kim, Seoul (KR); Kyujin Kim, Seoul (KR); Chulkwon Park, Hwaseong-si (KR); Sunghee Han, Hwaseong-si (KR); Yoosang Hwang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/525,187

(22) Filed: Nov. 30, 2023

(65) Prior Publication Data

US 2024/0114676 A1   Apr. 4, 2024

Related U.S. Application Data

(63) Continuation of application No. 17/720,664, filed on Apr. 14, 2022, now Pat. No. 11,889,681.

(30) Foreign Application Priority Data

Apr. 21, 2021   (KR) .................. 10-2021-0051825

(51) Int. Cl.
   *H10B 12/00*   (2023.01)
(52) U.S. Cl.
   CPC .......... *H10B 12/34* (2023.02); *H10B 12/053* (2023.02); *H10B 12/315* (2023.02); *H10B 12/482* (2023.02)

(58) Field of Classification Search
   CPC .... H10B 12/053; H10B 12/315; H10B 12/34; H10B 12/482
   (Continued)

(56) References Cited

U.S. PATENT DOCUMENTS 7,682,902 B2   3/2010   Hsiao et al.
7,723,191 B2   5/2010   Kang et al.
(Continued)

FOREIGN PATENT DOCUMENTS

TW   201434153 A   9/2014
TW   201834215 A   9/2018
TW   202011517 A   3/2020

*Primary Examiner* — Hoai V Pham
(74) *Attorney, Agent, or Firm* — Myers Bigel, P.A.

(57) ABSTRACT

An integrated circuit device includes a substrate having an active region and a word line trench therein. The word line trench includes a lower portion having a first width, and an upper portion, which extends between the lower portion and a surface of the substrate and has a second width that is greater than the first width. A word line is provided, which extends in and adjacent a bottom of the word line trench. A gate insulation layer is provided, which extends between the word line and sidewalls of the lower portion of the word line trench. An electrically insulating gate capping layer is provided in the upper portion of the word line trench. An insulation liner is provided, which extends between the gate capping layer and sidewalls of the upper portion of the word line trench. The gate insulation layer extends between the insulation liner and a portion of the gate capping layer, which extends within the upper portion of the word line trench.

20 Claims, 31 Drawing Sheets

(58) Field of Classification Search
USPC .......................................................... 257/330
See application file for complete search history.

(56) References Cited

U.S. PATENT DOCUMENTS

| | | |
|---|---|---|
| 9,082,848 B2 | 7/2015 | Kim |
| 9,082,866 B2 | 7/2015 | Sakaguchi et al. |
| 9,178,039 B2 | 11/2015 | Park et al. |
| 9,276,074 B2 | 3/2016 | Choi et al. |
| 9,362,422 B2 | 6/2016 | Lim |
| 9,704,988 B2 | 7/2017 | Oh |
| 10,727,245 B2 | 7/2020 | Xu et al. |
| 10,896,967 B2 | 1/2021 | Yoon et al. |
| 11,600,622 B2 * | 3/2023 | Zhang .................. H10B 12/485 |
| 2004/0094789 A1 | 5/2004 | Tran et al. |
| 2007/0215931 A1 | 9/2007 | Kianian et al. |
| 2019/0393320 A1 | 12/2019 | Yoo et al. |
| 2020/0381436 A1 | 12/2020 | Noh et al. |

* cited by examiner

METHOD OF FORMING AN INTEGRATED CIRCUIT DEVICES HAVING BURIED WORD LINES

REFERENCE TO PRIORITY APPLICATION

This application is a continuation of U.S. patent application Ser. No. 17/720,664, filed Apr. 14, 2022, which itself claims priority under 35 U.S.C. § 119 to Korean Patent Application No. 10-2021-0051825, filed Apr. 21, 2021, the disclosures of both of which are hereby incorporated herein by reference.

BACKGROUND

The inventive concept relates to integrated circuit devices and methods of forming the same and, more particularly, to highly integrated circuit devices having buried active regions therein and methods of forming the same.

As integrated circuit devices are being downscaled, the sizes of individual micro circuit patterns for implementing integrated circuit devices are being further reduced. Unfortunately, because the width of word lines within buried channel transistors continue to decrease and spacing between the word lines also decrease, there is an ongoing problem caused by electrical coupling between adjacent word lines. In addition, the complexity of manufacturing devices with buried word lines also increases, which may lead to lower overall device yield and lower reliability and performance characteristics.

SUMMARY

The inventive concept provides an integrated circuit device having excellent electrical performance due to reduced electrical coupling between adjacent word lines.

According to an aspect of the inventive concept, there is provided an integrated circuit device having a substrate with a semiconductor active region therein. A word line is provided, which is disposed inside a word line trench formed in the substrate. The word line may extend in a first direction parallel to a top surface of the substrate. A bit line is provided, which extends on the substrate in a second direction perpendicular to the first direction. A gate insulation layer is provided, which is disposed on inner walls of the word line trench, and on surrounding sidewalls and a bottom surface of the word line. A gate capping layer is provided, which is disposed inside the word line trench and on the word line. In some embodiments, the word line trench includes: (i) a lower portion having a first width in the second direction, and (ii) an upper portion disposed at a level higher than that of the lower portion (and having a second width greater than the first width in the second direction). An inflection portion is defined between the lower portion and the upper portion of the word line trench.

According to another embodiment, an integrated circuit device is provided, which includes a substrate having an active region therein. A word line is disposed inside a word line trench, which is formed in the substrate and may extend in a first direction parallel to a top surface of the substrate. A bit line is provided, which extends on the substrate in a second direction perpendicular to the first direction. A gate insulation layer is provided, which is disposed on inner walls of the word line trench and on surrounding sidewalls and a bottom surface of the word line. A gate capping layer is provided, which is disposed inside the word line trench and on the word line. The gate capping layer includes an upper portion having a width greater than a width of the word line in the second direction. An insulation liner is provided, which is disposed on sidewalls of the upper portion of the word line trench, and between the gate insulation layer and the substrate.

According to another embodiment, an integrated circuit device is provided, which includes a substrate having an active region therein. A word line trench is formed in the substrate, and may extend in a first direction parallel to a top surface of the substrate. The word line trench includes a lower portion having a first width, as measured in a second direction perpendicular to the first direction, and an upper portion having a second width greater than the first width. A word line is provided, which is disposed inside the word line trench. A gate insulation layer is provided, which is disposed on inner walls of the word line trench. The gate insulation layer surrounds sidewalls and a bottom surface of the word line. A gate capping layer is provided, which is disposed on inner walls of the word line trench and on the word line. An insulation liner is provided, which is disposed on the upper portion of the word line trench and between the gate insulation layer and the substrate. A bit line is provided, which extends in the second direction on the substrate. A direct bit line contact is provided, which extends between the active region of the substrate and the bit line.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1:
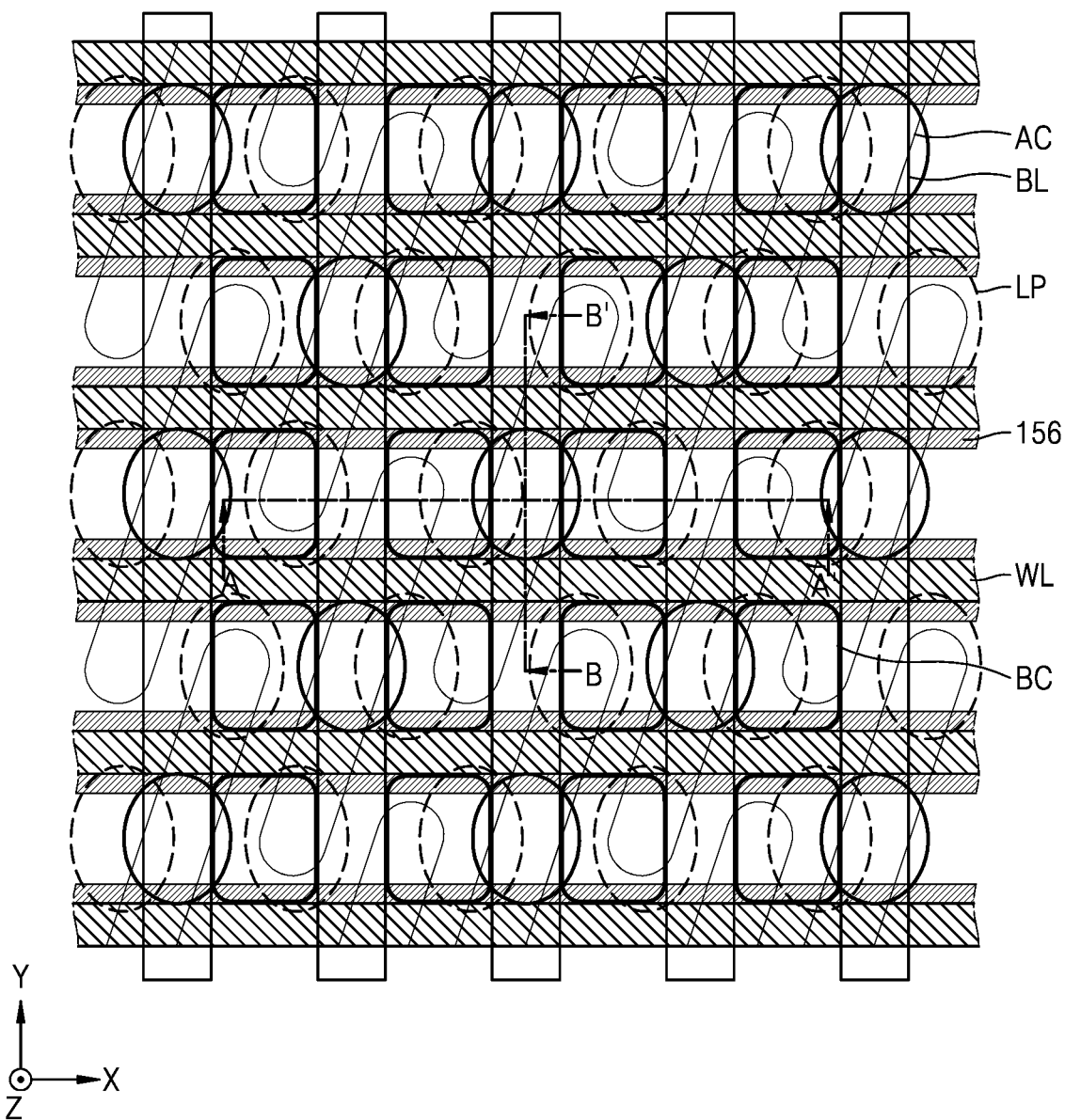
FIG. 1 is a layout diagram showing an integrated circuit device according to example embodiments.
Figure 2:
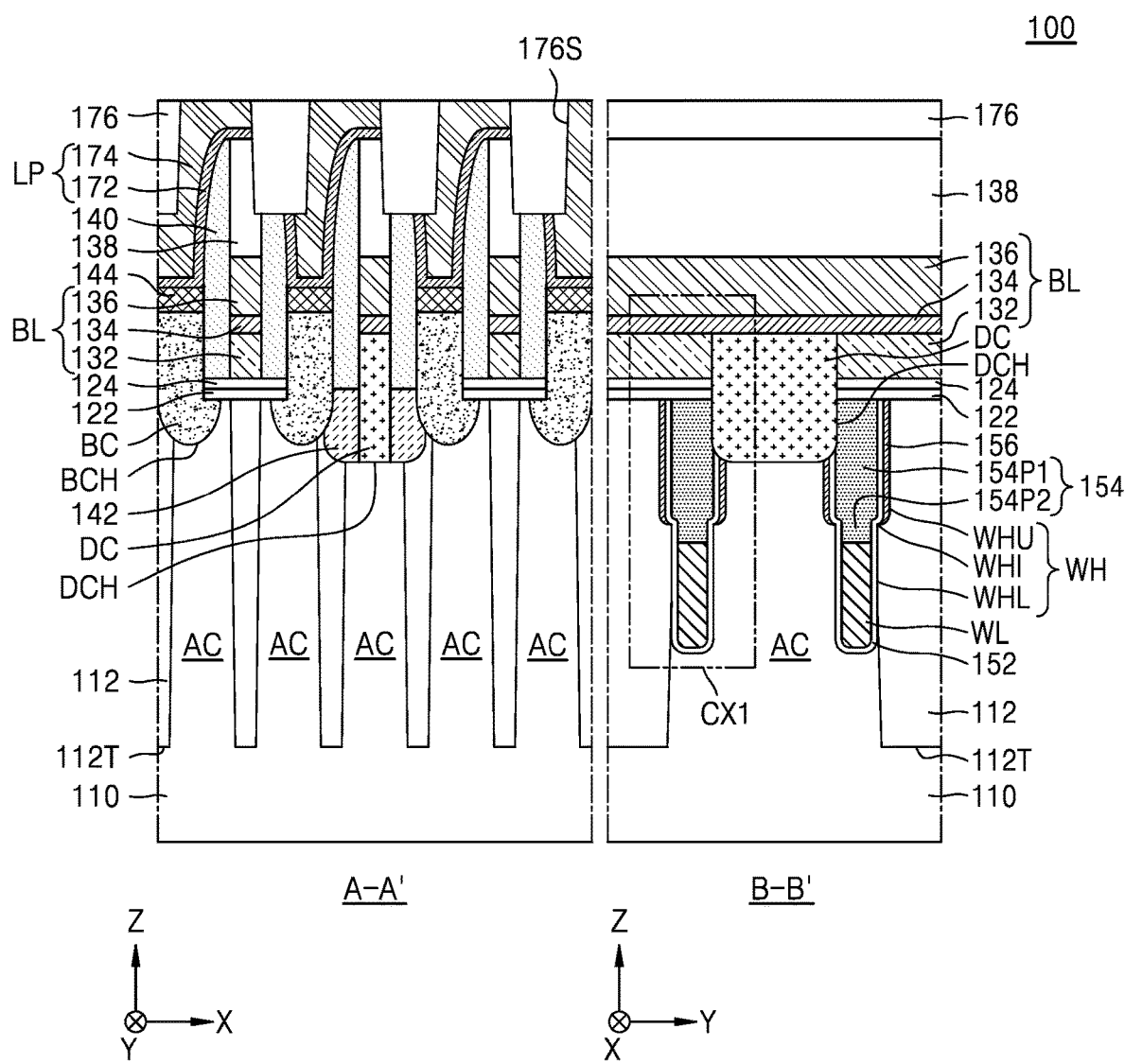
FIG. 2 is a cross-sectional view taken along line A-A' and line B-B' of FIG. 1.

FIG. 1 is a layout diagram showing an integrated circuit device 100 according to example embodiments. FIG. 2 is a cross-sectional view taken along lines A-A' and B-B' of FIG. 1, and FIG. 3 is a partially enlarged view of highlighted region CX1 of FIG. 2.

Figure 3:
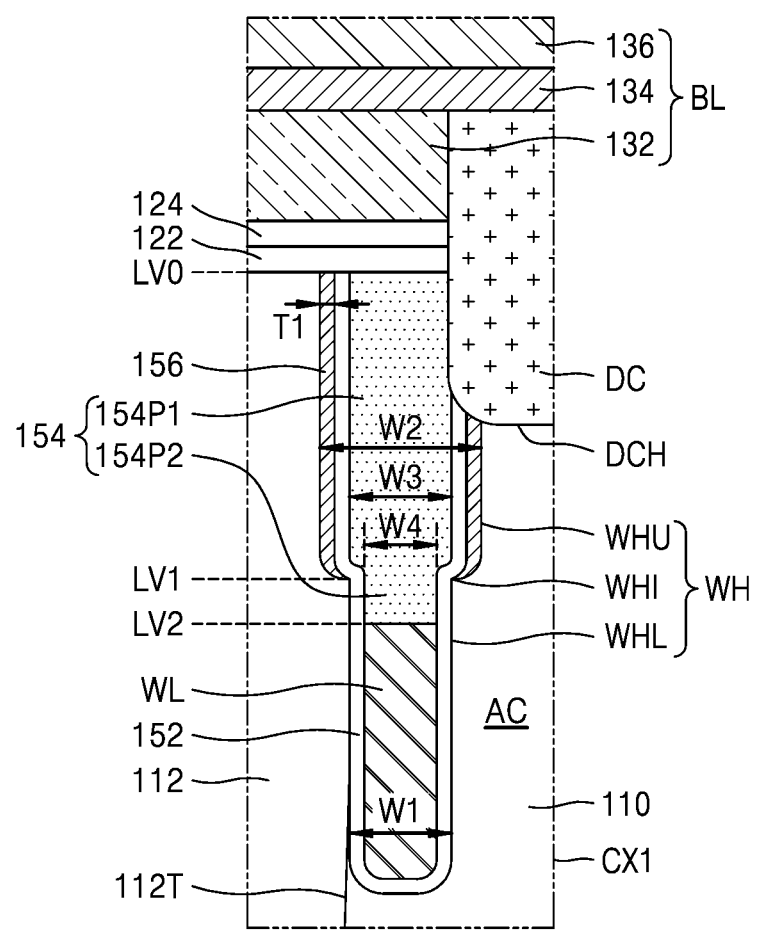
FIG. 3 is an enlarged view of region CX1 of FIG. 2.

Referring to FIGS. 1 to 3, a device isolation trench 112T is formed in a substrate 110, and a device isolation layer 112 may be formed in, and may at least partially fill, the device isolation trench 112T. A plurality of active regions AC may be defined in the substrate 110, between corresponding portions of the device isolation layer 112.

The active regions AC may be arranged to have long axes diagonal to a first direction X and a second direction Y, as shown by FIG. 1. A plurality of word lines WL may extend in parallel to one another in the first direction, X, across the active regions AC. An insulation liner 156 may extend in the first direction X on both sidewalls of each of the word lines WL. In addition, a plurality of bit lines BL may extend in parallel to one another in the second direction, Y, on the word lines WL. The bit lines BL may be connected to the active regions AC via direct contacts DC.

A buried contact BC may be formed between each two adjacent bit lines BL from among the bit lines BL. The buried contacts BC may be linearly arranged in the first direction X and the second direction Y. A plurality of landing pads LP may be respectively formed on the buried contacts BC. The buried contacts BC and the landing pads LP may connect bottom electrodes (not shown) of capacitors formed over the bit lines BL to the active regions AC. The landing pads LP may be arranged to partially overlap the buried contacts BC, respectively.

The substrate 110 may include silicon, such as monocrystalline silicon, polycrystalline silicon, silicon-on-insulator, and/or amorphous silicon. In some other embodiments, the substrate 110 may include at least one selected from among Ge, SiGe, SiC, GaAs, InAs, and InP. In some embodiments, the substrate 110 may include a conductive region (e.g., a well doped with an impurity or a structure doped with an impurity). The device isolation layer 112 may include an oxide film, a nitride film, or a combination thereof.

A plurality of word line trenches WH extending in the first direction X are formed in the substrate 110. The word line trenches WH may each include a lower portion WHL, an upper portion WHU, and an inflection portion WHI, as shown in cross-section by FIG. 3. The lower portion WHL may have a first width W1 in the second direction Y. For example, the first width W1 thereof may be, but is not limited to, from about 3 nm (i.e., 30 Å) to about 100 nm (i.e., 1000 Å). The upper portion WHU is at a vertical level higher than that of the lower portion WHL and may have a second width W2 that is greater than the first width W1 in the second direction Y. For example, the second width W2 may be from about 110% to about 200% of the first width W1. For example, the second width W2 may be from about 5 nm (i.e., 50 Å) to about 200 nm (i.e., 2000 Å).

The inflection portion WHI may refer to a portion of a word line trench WH in which the width thereof changes discontinuously. For example, the inflection portion WHI may refer to a sidewall portion of the word line trench WH in which a sidewall inclination, in a transition from the lower portion WHL to the upper portion WHU, changes rapidly. The inflection portion WHI may be defined between the lower portion WHL and the upper portion WHU and sidewalls of the upper portion WHU may extend outward with respect to sidewalls of the lower portion WHL.

A plurality of gate insulation layers 152, the word lines WL, a plurality of gate capping layers 154, and a plurality of insulation liners 156 may be arranged in the word line trenches WH. The gate insulation layer 152 may be conformally arranged on inner walls of the word line trench WH, without interruption, along the upper portion WHU, the inflection portion WHI, and the lower portion WHL of the word line trench WH. The word lines WL may be arranged in the lower portion WHL of the word line trench WH, and sidewalls and the bottom surface of the word line WL may be surrounded by the gate insulation layer 152.

A gate capping layer 154 may be arranged on the word line WL, as shown by FIG. 3. The gate capping layer 154 may include a first "upper" portion 154P1 at a vertical level higher than that of the inflection portion WHI and a second "lower" portion 154P2 at a vertical level lower than that of the inflection portion WHI. The first portion 154P1 may be inside the upper portion WHU of the word line trench WH, whereas the second portion 154P2 may be inside the lower portion WHL of the word line trench WH. For example, the first portion 154P1 may have a third width W3 in the second direction Y, whereas the second portion 154P2 may have a fourth width W4 that is less than the third width W3 in the second direction Y.

The insulation liners 156 may be arranged on inner walls of the upper portion WHU of the word line trench WH. For example, the insulation liners 156 may extend from the top surface of the substrate 110 to the inflection portion WHI along the upper portion WHU of the word line trench WH and may be between the gate insulation layer 152 and the substrate 110. The insulation liner 156 may have a first thickness T1 in the second direction Y. The first thickness T1 thereof may be, but is not limited to, from about 0.5 nm (i.e., 5 Å) to about 10 nm (i.e., 100 Å).

Advantageously, the insulation liners 156 may perform a dual-function as an etching mask in a 2-stage etching operation for forming the word line trenches WH, including the upper portion WHU and the lower portion WHL having different widths, and partially remain, as an electrical insulator, after the etching mask is partially removed. In a manufacturing method according to example embodiments, the upper portion WHU of the word line trench WH may be formed first, and then the insulation liners 156 may be formed on the inner walls of the upper portion WHU. Next, the lower portion WHL of the word line trench WH may be formed by partially etching the substrate 110 using the insulation liner 156 as an etching mask, however, as the insulation liner 156 is partially removed thickness-wise during etching of the substrate 110, the insulation liner 156 may become thinner.

As shown in FIG. 3, the top surface of the substrate 110 may be at a reference level LV0 (i.e., on a primary surface of the substrate 110) and the inflection portion WHI may be at a first vertical level LV1 that is lower than (i.e., below) the reference level LV0. The top surface of the "buried" word line WL may be at a second vertical level LV2 that is lower than the first vertical level LV1. For example, a distance from the top surface of the word line WL to the top surface of the substrate 110 may be greater than a distance from the inflection portion WHI to the top surface of the substrate 110. Also, because the insulation liner 156 is placed on the inner wall of the upper portion WHU of the word line trench WH, the bottom surface of the insulation liner 156 may be at a level higher than that of the top surface of the word line WL.

As shown in FIG. 2, a distance between lower portions WHL of two adjacent word line trenches WH may be greater than a distance between upper portions WHU of the two adjacent word line trenches WH. Therefore, a relatively large distance may be secured between two word lines WL arranged in the lower portions WHL of the two adjacent word line trenches WH. Accordingly, any electrical coupling (or a disturbance caused by switching one word line WL relative to another, adjacent, word line WL) may be reduced or prevented.

In example embodiments, the word lines WL may include Ti, TiN, Ta, TaN, W, WN, TiSiN, WSiN, polysilicon, or a combination thereof. The "sidewall" gate insulation layer 152 may include a silicon oxide film, a silicon nitride film, a silicon oxynitride film, an oxide/nitride/oxide (ONO) film, or a high-k dielectric film having a dielectric constant higher than that of the silicon oxide film. The gate capping layer 154 may include a silicon oxide film, a silicon nitride film, a silicon oxynitride film, or a combination thereof. The insulation liner 156 may include a silicon oxide film, a silicon nitride film, a silicon oxynitride film, or a combination thereof.

A first lower insulation layer 122 and a second lower insulation layer 124 covering the top surface of the gate capping layer 154 may be arranged on the substrate 110. In some embodiments, the first lower insulation layer 122 may include a silicon oxide, whereas the second lower insulation layer 124 may include a silicon oxynitride or a silicon nitride.

A plurality of direct contacts DC may be respectively formed in a plurality of direct contact holes DCH in the substrate 110. The direct contacts DC may be respectively connected to the active regions AC. The direct contacts DC may include doped polysilicon. For example, the direct contacts DC may include polysilicon containing an n-type impurity like phosphor (P), arsenic (As), bismuth (Bi), and antimony (Sb) at a relatively high concentration.

The bit lines BL may extend in the second direction Y over the substrate 110 and the direct contacts DC. The bit lines BL may be connected to the active regions AC via the direct contacts DC, respectively. The bit lines BL may each include a lower conductive layer 132, an intermediate conductive layer 134, and an upper conductive layer 136 that are sequentially stacked on the substrate 110. The lower conductive layer 132 may include Si, Ge, W, WN, Co, Ni, Al, Mo, Ru, Ti, TiN, Ta, TaN, Cu, or a combination thereof. For example, the lower conductive layer 132 may include polysilicon. The intermediate conductive layer 134 and the upper conductive layer 136 may each include TiN, TiSiN, W, tungsten silicide, or a combination thereof. In example embodiments, the intermediate conductive layer 134 may include TiN, TiSiN, or a combination thereof, whereas the upper conductive layer 136 may include W. The bit lines BL may be covered by a plurality of bit line capping layers 138, respectively. The bit line capping layers 138 may include silicon nitride, and may extend in the second direction Y on the bit lines BL.

Bit line spacers 140 may be arranged on both sidewalls of each of the bit lines BL, and the bit line spacers 140 may extend in the second direction Y on both sidewalls of the bit lines BL. In some embodiments, as shown in FIG. 2, a bit line spacer 140 may have a single layer structure; however, in other embodiments, the bit line spacer 140 may have a structure including a plurality of material layers. For example, the bit line spacer 140 may have an air spacer structure including an air space surround by insulation layers. A direct contact spacer 142 that fills the interior of the direct contact hole DCH and covers both sidewalls of the direct contact DC may be disposed below the bit line spacer 140.

A plurality of buried contacts BC and a plurality of insulation fences (not shown) may be arranged in a row in the second direction Y, between the bit lines BL. The buried contacts BC may extend from buried contact holes BCH formed in the substrate 110 in a vertical direction (Z direction). The insulation fences are arranged on the gate capping layers 154 arranged on the word line trenches WH and may each be arranged between two adjacent buried contacts BC. In the second direction Y, both sidewalls of each of the buried contacts BC may be insulated from each other by the insulation fences. The insulation fence may include silicon nitride films.

A plurality of metal silicide films 144 and the landing pads LP may be formed over the buried contacts BC. The metal silicide films 144 and the landing pads LP may be arranged to vertically overlap the buried contacts BC. A metal silicide film 144 may include cobalt silicide, nickel silicide, or manganese silicide. The landing pads LP may be connected to the buried contacts BC via the metal silicide films 144, respectively.

The landing pads LP may cover at least portions of the top surfaces of the bit line capping layers 138 to vertically overlap portions of the bit lines BL. The landing pads LP may each include a conductive barrier film 172 and a landing pad conductive layer 174. The conductive barrier film 172 may include Ti, TiN, or a combination thereof. The landing pad conductive layer 174 may include a metal, a metal nitride, a conductive polysilicon, or a combination thereof. For example, the landing pad conductive layer 174 may include W. The landing pads LP may have a pattern shape of a plurality of islands in a view from above.

The landing pads LP may be electrically insulated from one another by an insulation pattern 176 filling an insulation space (not shown) around the landing pads LP. In some embodiments, the insulation pattern 176 may include a silicon nitride, a silicon oxynitride, a silicon oxide, or a combination thereof. In some embodiments, the insulation pattern 176 may include a first material layer (not shown) and a double-layer structure of a second material layer (not shown), wherein the first material layer may include a low-k material, such as $SiO_2$, SiOCH, and SiOC, and the second material layer may include a silicon nitride or a silicon oxynitride.

Generally, as a distance between adjacent word lines is reduced, a problem, such as an electrical/capacitive coupling disturbance, may occur between the closely-spaced word lines. And, when the width of a word line is reduced to reduce this coupling disturbance, a difficulty in forming a metal layer constituting a word line within a relatively narrow word line trench, and an etchback process on the upper portion of the metal layer may significantly increase. Therefore, when precise control of an etchback process fails, deviation of heights of word lines becomes relatively large (or a window of heights of word lines becomes larger). Accordingly, it may be difficult for a plurality of buried channel transistors formed using the buried word lines to have uniform electrical properties.

According to example embodiments, the upper portion WHU of the word line trench WH may be formed with a relatively large width first, and then the lower portion WHL of the word line trench WH may be formed with a width less than that of the upper portion WHU by using the insulation liner 156 as a dual-function sidewall insulator and etching mask. Therefore, due to the relatively large width of the upper portion WHU of the word line trench WH, the difficulty of an etchback process of forming the word line WL may decrease, and the etchback process may be more precisely controlled. Furthermore, a sufficiently large distance may be secured between the word lines WL in the lower portion WHL of the word line trench WH, and thus, an electrical/capacitive coupling or a disturbance may be reduced or prevented. Thus, the integrated circuit device 100, as described above, may have excellent and reliable electrical performance characteristics and high manufacturing yield.

Figure 4:
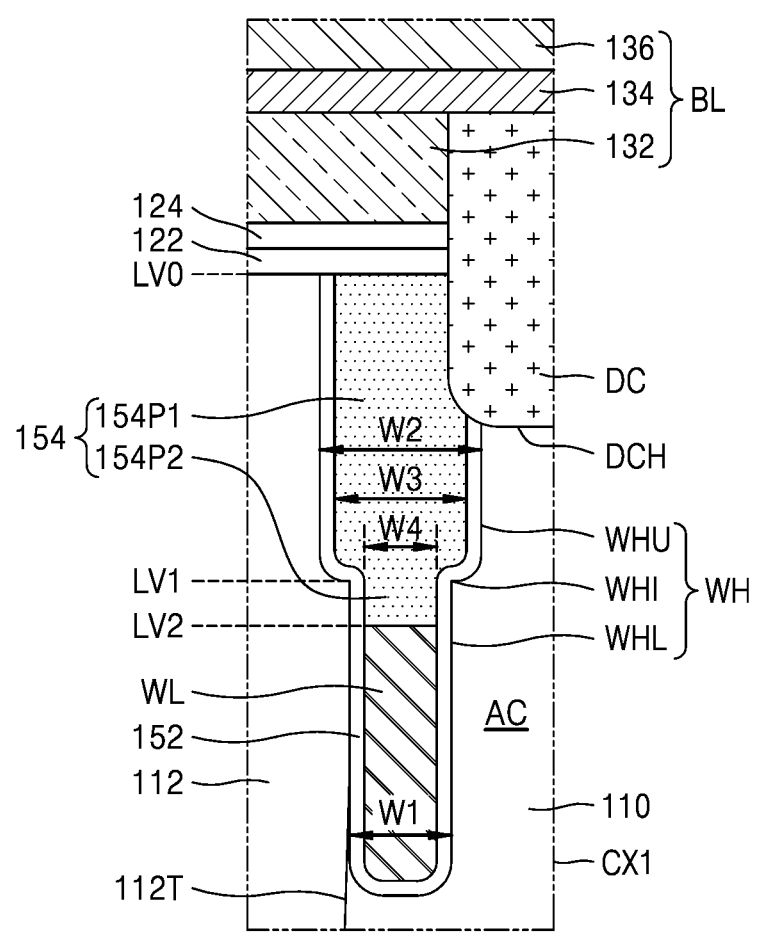
FIG. 4 is a cross-sectional view of an integrated circuit device according to example embodiments.

FIG. 4 is a cross-sectional view of an integrated circuit device 100A according to example embodiments. In particular, FIG. 4 is an enlarged view of a portion corresponding to a region CX1 in FIG. 2. In FIG. 4, reference numerals that are the same as those in FIGS. 1 to 3 denote the same elements.

Referring to FIG. 4, the insulation liner 156 (see, e.g., FIG. 3) may not be disposed on the inner walls of the upper portion WHU of the word line trench WH. The gate insulation layer 152 may be arranged on the inner walls of the upper portion WHU of the word line trench WH, and a first portion 154P1 of the gate capping layer 154 may entirely fill the upper portion WHU of the word line trench WH on the gate insulation layer 152.

The insulation liners 156 may function as an etching mask in a 2-stage etching operation for forming the word line trenches WH including the upper portion WHU and the lower portion WHL having different widths. In a manufacturing method according to example embodiments, the upper portion WHU of the word line trench WH may be formed first, and then the insulation liners 156 may be formed on the inner walls of the upper portion WHU. Next, the lower portion WHL of the word line trench WH may be formed by partially etching the substrate 110 by using the insulation liner 156 as an etching mask, wherein the insulation liner 156 may be completely removed. As the insulation liner 156 is removed, the gate capping layer 154 may have a relatively large width in the upper portion WHU of the word line trench WH.

According to the example embodiments described above, due to the relatively large width of the upper portion WHU of the word line trench WH, the difficulty of an etchback process of forming the word line WL may decrease, and the etchback process may be precisely controlled. Furthermore, a sufficiently large distance may be secured between the word lines WL in the lower portion WHL of the word line trench WH, and thus, an electrical coupling or a disturbance may be reduced or prevented. The integrated circuit device 100A as described above may have excellent electrical performance.

Figure 5:
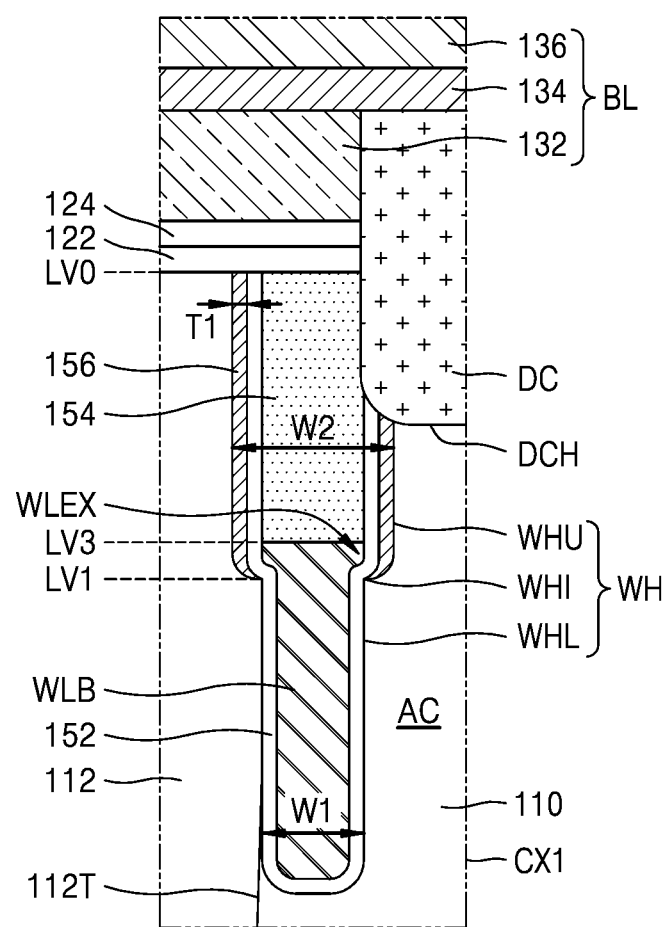
FIG. 5 is a cross-sectional view of an integrated circuit device according to example embodiments.

FIG. 5 is a cross-sectional view of an integrated circuit device 100B according to example embodiments. FIG. 5 is an enlarged view of a portion corresponding to the region CX1 in FIG. 2. In FIG. 5, reference numerals that are the same as those in FIGS. 1 to 4 denote the same elements.

Referring to FIG. 5, the top surface of the substrate 110 may be at the reference level LV0, the inflection portion WHI may be at the first vertical level LV1 that is lower than the reference level LV0, and the top surface of a word line WLB may be at a third vertical level LV3 that is higher than the first vertical level LV1. For example, a distance from the top surface of the word line WLB to the top surface of the substrate 110 may be less than a distance from the inflection portion WHI to the top surface of the substrate 110. Also, because the insulation liner 156 is on the inner wall of the upper portion WHU of the word line trench WH, the bottom surface of the insulation liner 156 may be at a level lower than that of the top surface of the word line WLB.

As shown in FIG. 5, the word line WLB may include an extended portion WLEX at the upper portion thereof. The extended portion WLEX is at a vertical level higher than the inflection portion WHI of the word line trench WH and may be inside the upper portion WHU of the word line trench WH.

According to the example embodiments described above, due to the relatively large width of the upper portion WHU of the word line trench WH, the difficulty of an etchback process of forming the word line WLB may decrease, and the etchback process may be precisely controlled. Furthermore, a sufficiently large distance may be secured between word lines WLB in the lower portion WHL of the word line trench WH, and thus, an electrical coupling or a disturbance may be reduced or prevented. The integrated circuit device 100B as described above may have excellent electrical performance.

Figure 6:
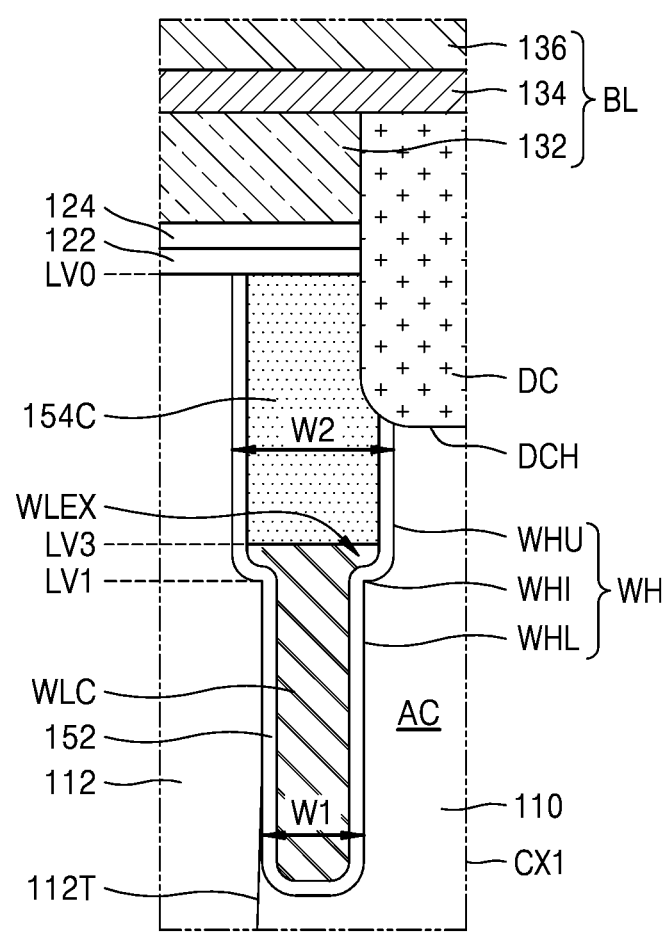
FIG. 6 is a cross-sectional view of an integrated circuit device according to example embodiments.

FIG. 6 is a cross-sectional view of an integrated circuit device 100C according to example embodiments. FIG. 6 is an enlarged view of a portion corresponding to the region CX1 in FIG. 2. In FIG. 6, reference numerals that are the same as those in FIGS. 1 to 5 denote the same elements.

Referring to FIG. 6, the insulation liner 156 (see, e.g., FIG. 5) may not be disposed on the inner walls of the upper portion WHU of the word line trench WH, and the top surface of a word line WLC may be at the third vertical level LV3 that is higher than the first vertical level LV1. The word line WLC may include an extended portion WLEX at an upper portion thereof. The extended portion WLEX is at a vertical level higher than the inflection portion WHI of the word line trench WH and may be inside the upper portion WHU of the word line trench WH.

An insulation capping layer 154C may be inside the upper portion WHU of the word line trench WH, and the bottom surface of the insulation capping layer 154C may be at a vertical level higher than that of the inflection portion WHI. The insulation capping layer 154C may have substantially flat sidewalls.

The insulation liners 156 may function as an etching mask in a 2-stage etching operation for forming the word line trenches WH including the upper portion WHU and the lower portion WHL having different widths. In a manufacturing method according to example embodiments, the upper portion WHU of the word line trench WH may be formed first, and then the insulation liners 156 may be formed on the inner walls of the upper portion WHU. Next, the lower portion WHL of the word line trench WH may be formed by partially etching the substrate 110 by using the insulation liner 156 as an etching mask, wherein the insulation liner 156 may be completely removed. As the insulation liner 156 is removed, the insulation capping layer 154C may have a relatively large width in the upper portion WHU of the word line trench WH.

Figure 7:
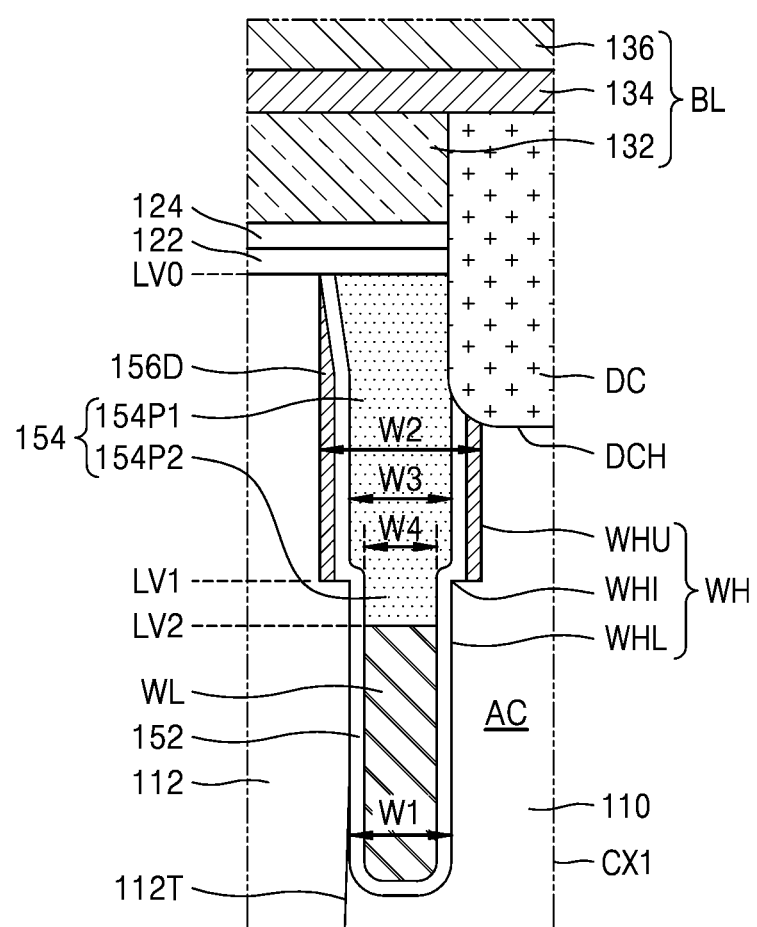
FIG. 7 is a cross-sectional view of an integrated circuit device according to example embodiments.

FIG. 7 is a cross-sectional view of an integrated circuit device 100D according to example embodiments. FIG. 7 is an enlarged view of a portion corresponding to the region CX1 in FIG. 2. In FIG. 7, reference numerals that are the same as those in FIGS. 1 to 6 denote the same elements.

Referring to FIG. 7, an insulation liner 156D disposed on the inner walls of the upper portion WHU of the word line trench WH may have a thickness decreasing upward. For example, the insulation liner 156D may have a shape tapered toward the upper portion WHU of the word line trench WH.

The insulation liner 156D may function as an etching mask in a 2-stage etching operation for forming the word line trenches WH including the upper portion WHU and the lower portion WHL having different widths. In a manufacturing method according to example embodiments, the upper portion WHU of the word line trench WH may be formed first, and then the insulation liner 156D may be formed on the inner walls of the upper portion WHU. Next, the lower portion WHL of the word line trench WH may be formed by partially etching the substrate 110 by using the insulation liner 156D as an etching mask, and an etching operation for partially removing the insulation liner 156D, thickness-wise, may be performed. Through the etching operation, a relatively large amount of the insulation liner 156D may be removed near the entrance of the word line trench WH, and thus, the insulation liner 156D may become thinner near the entrance of the word line trench WH.

FIGS. 8 to 27 are cross-sectional views sequentially showing operations of a method of manufacturing an integrated circuit device according to example embodiments. Referring to FIGS. 8 to 27, a method of manufacturing the integrated circuit device 100 shown in FIGS. 1 to 3 will be described.

Figure 8:
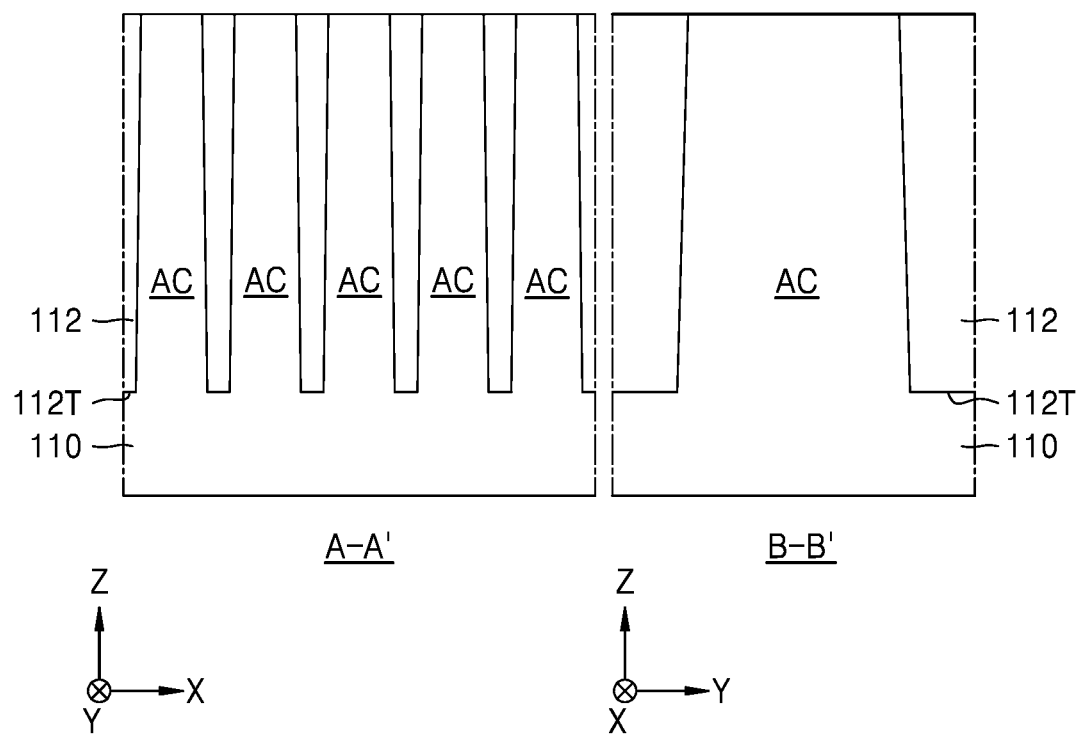
FIGS. 8 to 27 are cross-sectional views sequentially showing operations of a method of manufacturing an integrated circuit device, according to example embodiments.

Referring to FIG. 8, a plurality of device isolation trenches 112T may be formed in a substrate 110, and a device isolation layer 112 may be formed in the device isolation trenches 112T, thereby defining a plurality of active regions AC in the substrate 110. As shown in FIG. 1, the active regions AC may be arranged to have long axes diagonal to a first direction X and a second direction Y.

Figure 9:
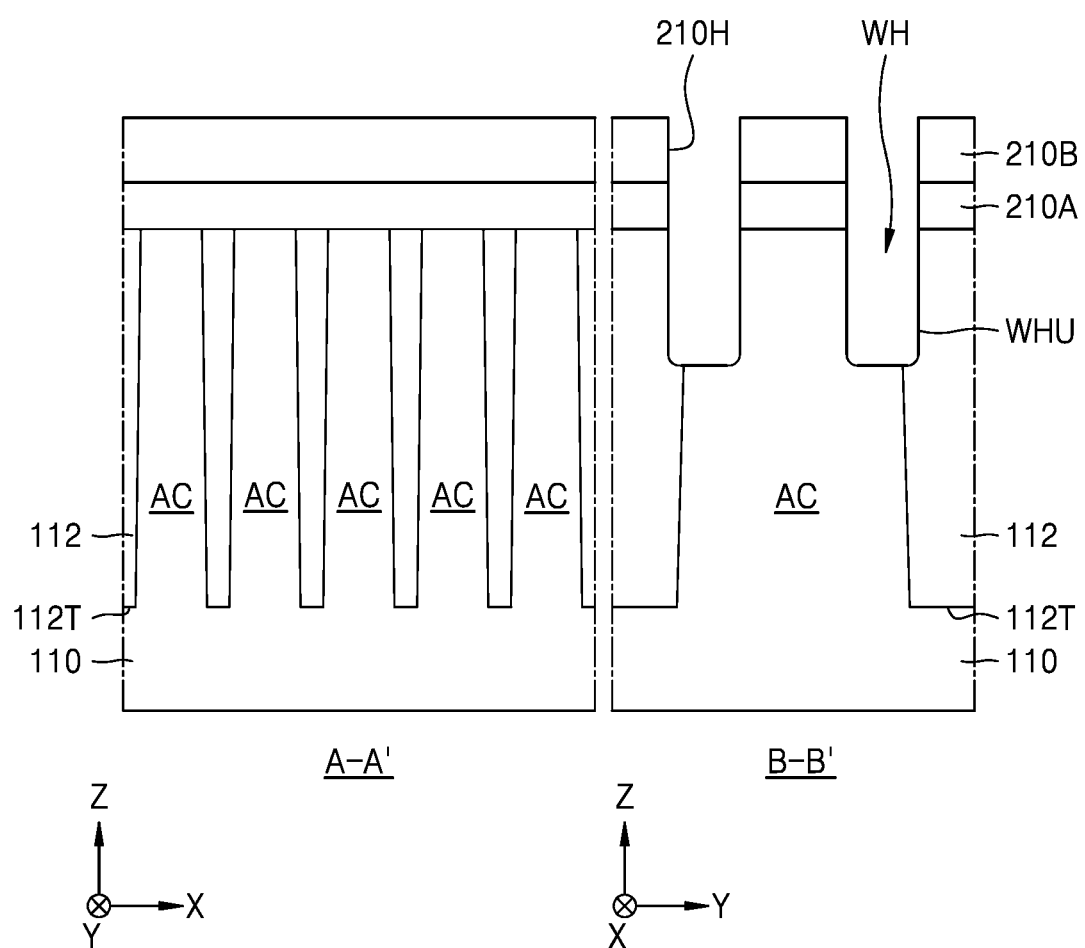

Referring to FIG. 9, a first hard mask layer 210A and a second hard mask layer 210B may be formed on the substrate 110. The first hard mask layer 210A and the second hard mask layer 210B may include openings 210H extending in the first direction X. Next, upper portions WHU of word line trenches WH may be formed in the substrate 110 by using the first hard mask layer 210A and the second hard mask layer 210B as an etching mask. An upper portion WHU of a word line trench WH may have a second width W2 (refer to FIG. 3) in the second direction Y, wherein the second width W2 may be from about 5 nm to about 200 nm.

Figure 10:
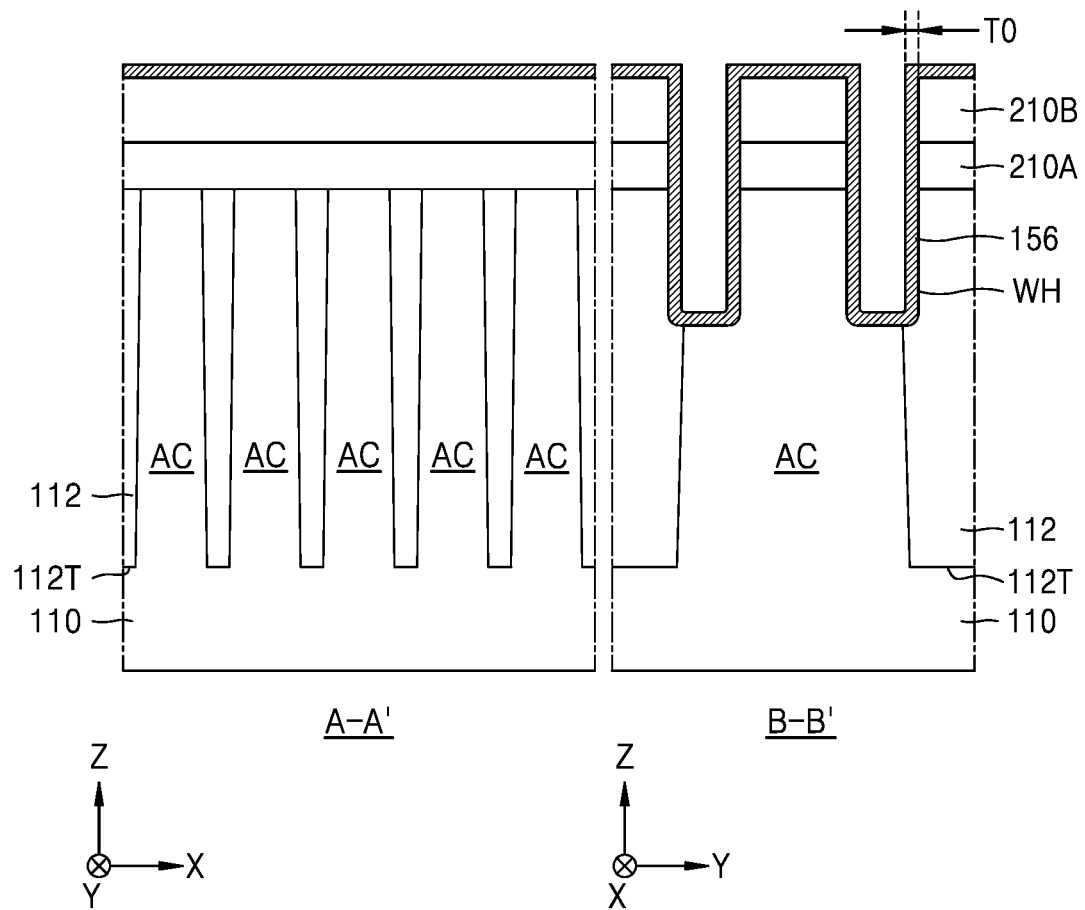

Referring to FIG. 10, an insulation liner 156 may be conformally formed on inner walls of the upper portion WHU of the word line trench WH and the top surface of the second hard mask layer 210B. In example embodiments, the insulation liner 156 may have an initial thickness T0 from about 1 nm to about 30 nm in the second direction Y, but the inventive concept is not limited thereto. In example embodiments, the insulation liner 156 may include a silicon oxide film, a silicon nitride film, a silicon oxynitride film, or a combination thereof. The insulation liner 156 may be formed through a chemical vapor deposition (CVD) process, an atomic layer deposition (ALD) process, etc.

Figure 11:
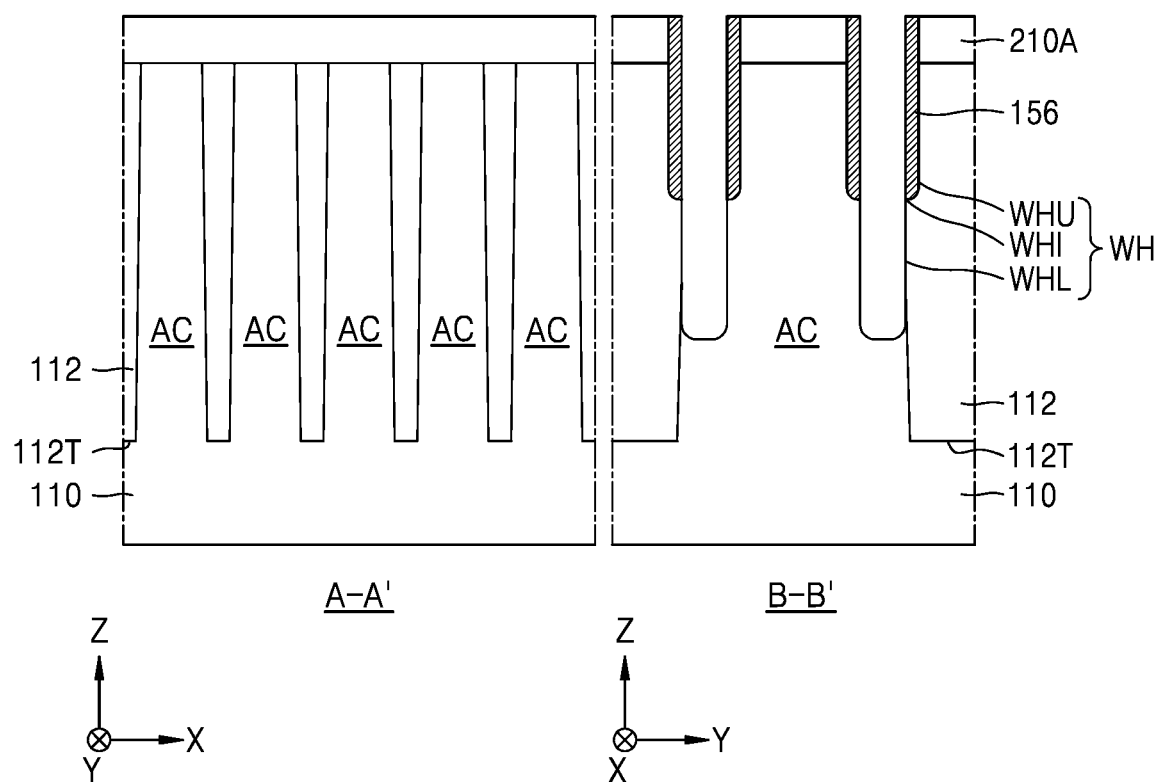

Referring to FIG. 11, an anisotropic etching operation is performed on the insulation liner 156, thereby removing a portion of the insulation liner 156 on the second hard mask layer 210B and a portion of the insulation liner 156 on the bottom of the upper portion WHU of the word line trench WH and leaving only a portion of the insulation liner 156 on the inner walls of the upper portion WHU of the word line trench WH.

Thereafter, a lower portion WHL of the word line trench WH is formed by expanding the word line trench WH in a vertical direction by using the portion of the insulation liner 156 on the inner walls of the upper portion WHU of the word line trench WH as an etching mask. For example, the lower portion WHL of the word line trench WH may have the first width W1 (refer to FIG. 3) in the second direction Y, wherein the first width W1 may be less than the second width W2. In example embodiments, the first width W1 may be from about 3 nm to about 100 nm.

As the insulation liner 156 functions as an etching mask, the inner walls of the insulation liner 156 and the sidewalls of the lower portion WHL may be aligned with respect to each other, and the width of the lower portion WHL may be limited in correspondence to a distance between two insulation liners 156 arranged on the inner walls of one word line trench WH. For example, the first width W1 may correspond to a difference between the second width W2 of the upper portion WHU of the word line trench WH and twice the initial thickness T0 of the insulation liner 156 (i.e., W1=W2−2T0).

The lower portion WHL is formed to have a smaller width than the upper portion WHU, and the inflection portion WHI may be defined between the lower portion WHL and the upper portion WHU. For example, the inflection portion WHI may refer to a portion of the word line trench WH in which the width of the word line trench WH changes discontinuously or may refer to a sidewall portion of the word line trench WH in which sidewall inclination varies rapidly. For example, the inflection portion WHI may be at the first vertical level LV1 (refer to FIG. 3), and the inflection portion WHI may be at the same level as the bottom surface of the insulation liner 156.

In example embodiments, at least a portion of the second hard mask layer 210B may be removed in an operation for forming the lower portion WHL and, as shown in FIG. 11, the top surface of the first hard mask layer 210A may be exposed as the second hard mask layer 210B is removed.

Figure 12:
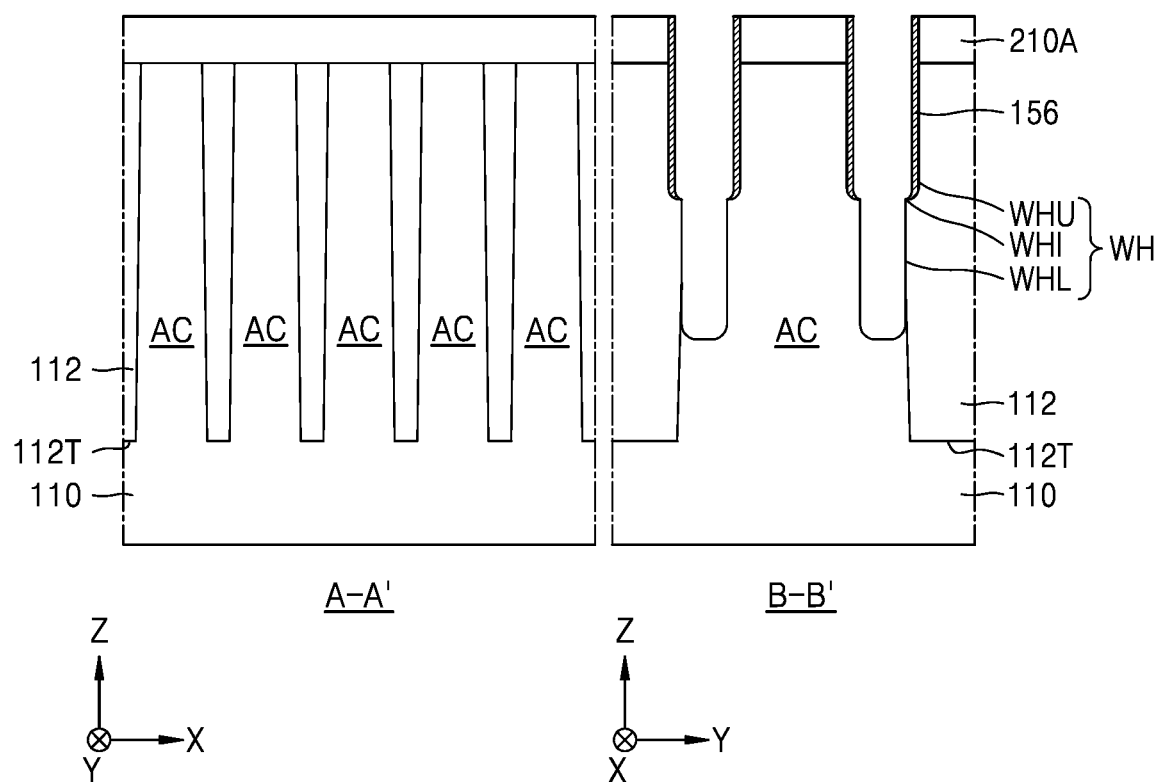

Referring to FIG. 12, an etching operation for removing a portion of the insulation liner 156 on the sidewalls of the upper portion WHU of the word line trench WH, thickness-wise, may be performed. For example, after the etching operation is performed, the insulation liner 156 may have the first thickness T1 (refer to FIG. 3) that is less than the initial thickness T0 (refer to FIG. 10). The first thickness T1 may be from about 0.5 nm to about 10 nm.

As the thickness of the insulation liner 156 is reduced from the initial thickness T0 to the first thickness T1, the top surface of the inflection portion WHI may be exposed inside the word line trench WH without being covered by the insulation liner 156. Also, the upper portion WHU may expand in lateral directions with respect to the lower portion WHL.

In some other embodiments, a portion of the insulation liner 156 around the entrance of the word line trench WH is exposed more to an etching atmosphere and removed more in an etching operation for forming the lower portion WHL and/or an etching operation for removing a portion of the insulation liner 156 thickness-wise, and thus, the thickness of the insulation liner 156 may decrease upward. In this case, the insulation liner 156D as described above with reference to FIG. 7 may be formed. Thereafter, a result structure in which the word line trench WH and the insulation liner 156 are formed may be cleaned.

Figure 13:
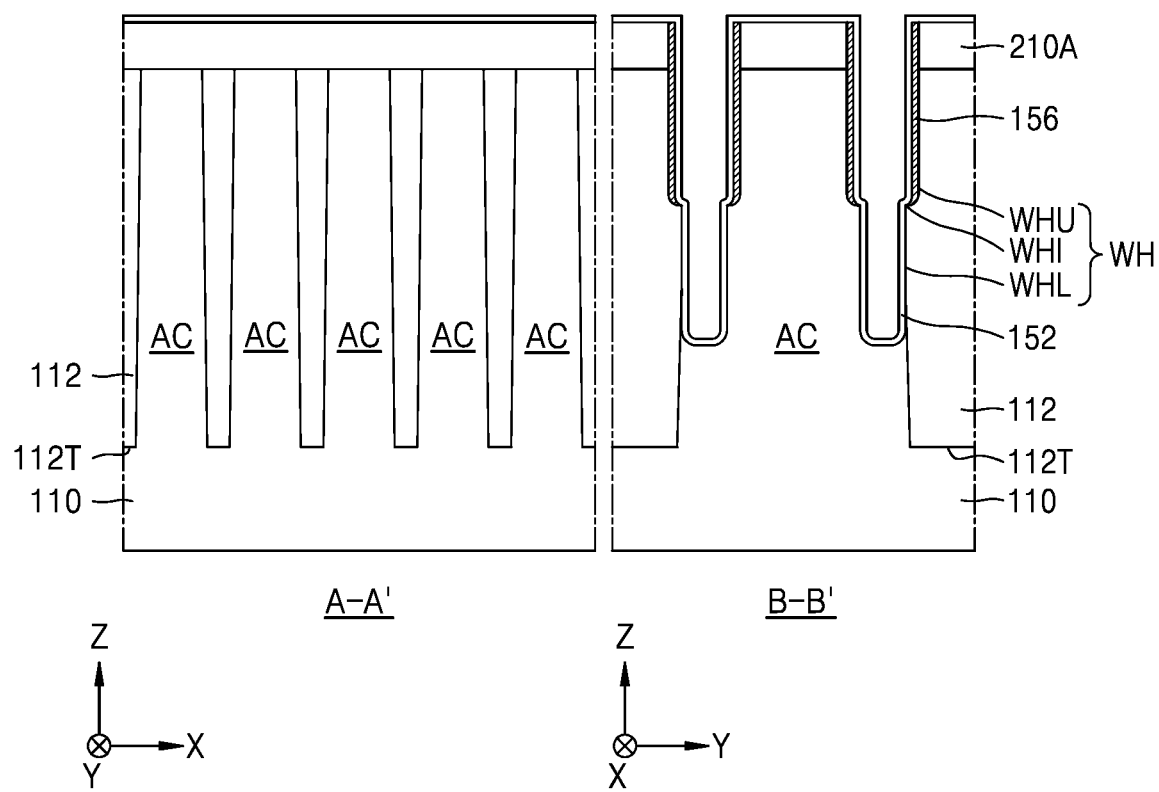

Referring to FIG. 13, gate insulation layers 152 may be formed on the inner walls of the word line trenches WH and on the first hard mask layer 210A. In example embodiments, the gate insulation layers 152 may be conformally arranged on the inner walls of the word line trenches WH along the upper portions WHU (e.g., on the insulation liner 156), the inflection portions WHI, and the lower portions WHL of the word line trenches WH. In example embodiments, the gate insulation layer 152 may include a silicon oxide film, a silicon nitride film, a silicon oxynitride film, an oxide/nitride/oxide (ONO) film, or a high-k dielectric film having a dielectric constant higher than that of the silicon oxide film.

Figure 14:
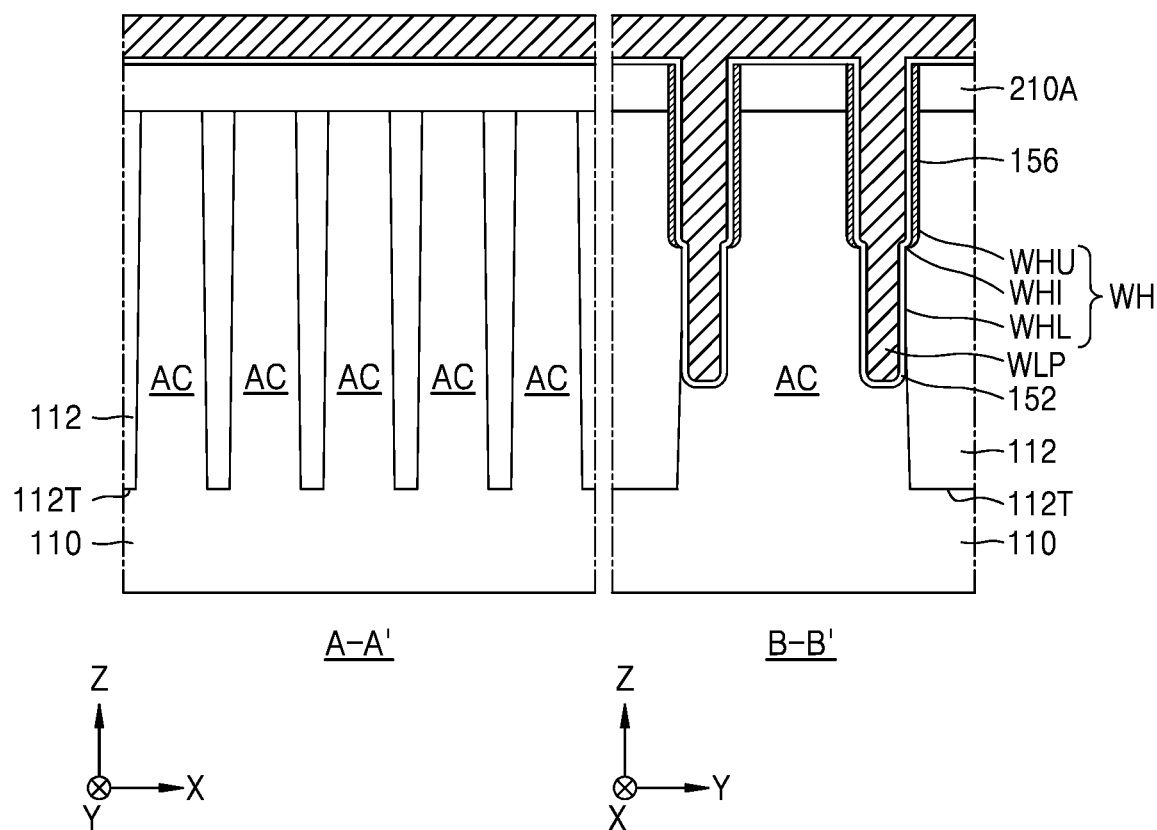

Referring to FIG. 14, a word line metal layer WLP may be formed in the word line trenches WH. The word line metal layer WLP may include Ti, TiN, Ta, TaN, W, WN, TiSiN, WSiN, polysilicon, or a combination thereof.

Figure 15:
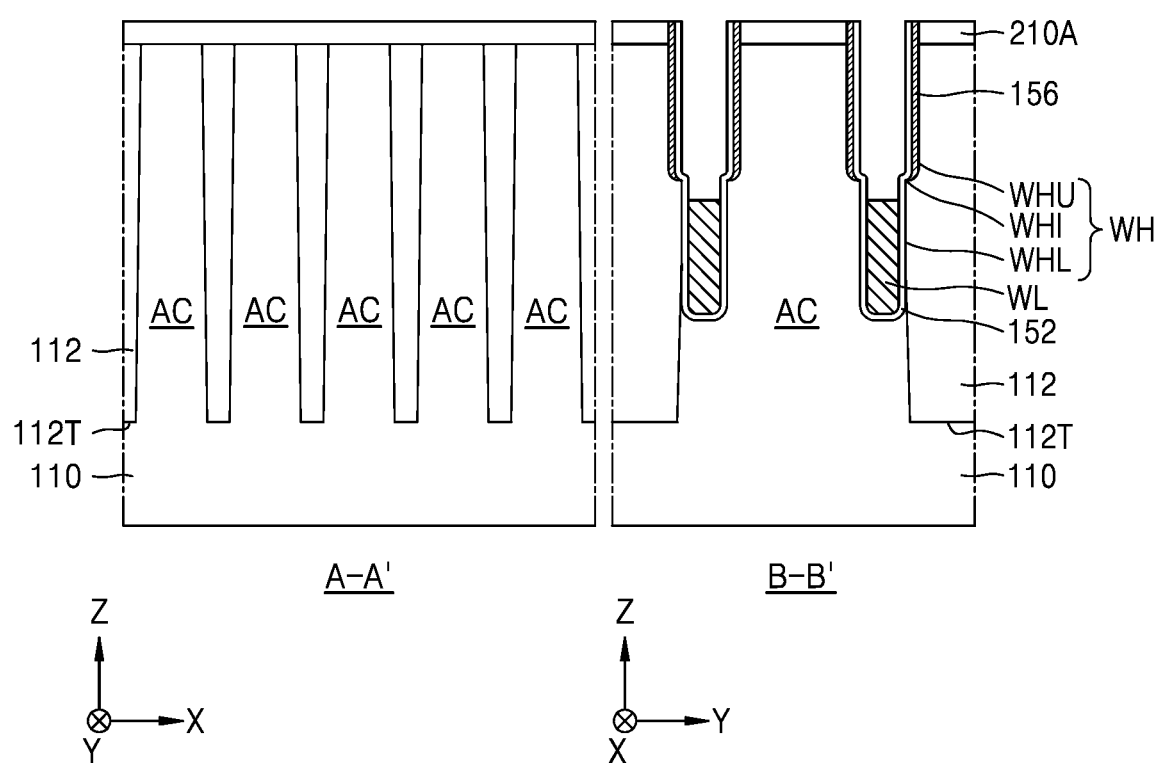

Referring to FIG. 15, a word line WL may be formed by performing an etchback operation on the word line metal layer WLP (refer to FIG. 14). In example embodiments, the etchback operation may be performed, such that the word line WL has the top surface at a lower level than the inflection portion WHI. In this case, the word line WL may be formed by sequentially performing a first etchback step for removing the upper portion of the word line metal layer WLP to the same level as the inflection portion WHI and a second etchback step for removing the upper portion of the word line metal layer WLP to a level lower than that of the inflection portion WHI. However, the etchback operation is not limited thereto.

For example, as a portion of the word line metal layer WLP inside the upper portion WHU of the word line trench WH having a relatively large width is removed in the first etchback step, the difficulty of the overall etchback operation may be lowered. Therefore, the etchback operation may be precisely controlled. For example, the height of the word line WL may be adjusted precisely.

Figure 16:
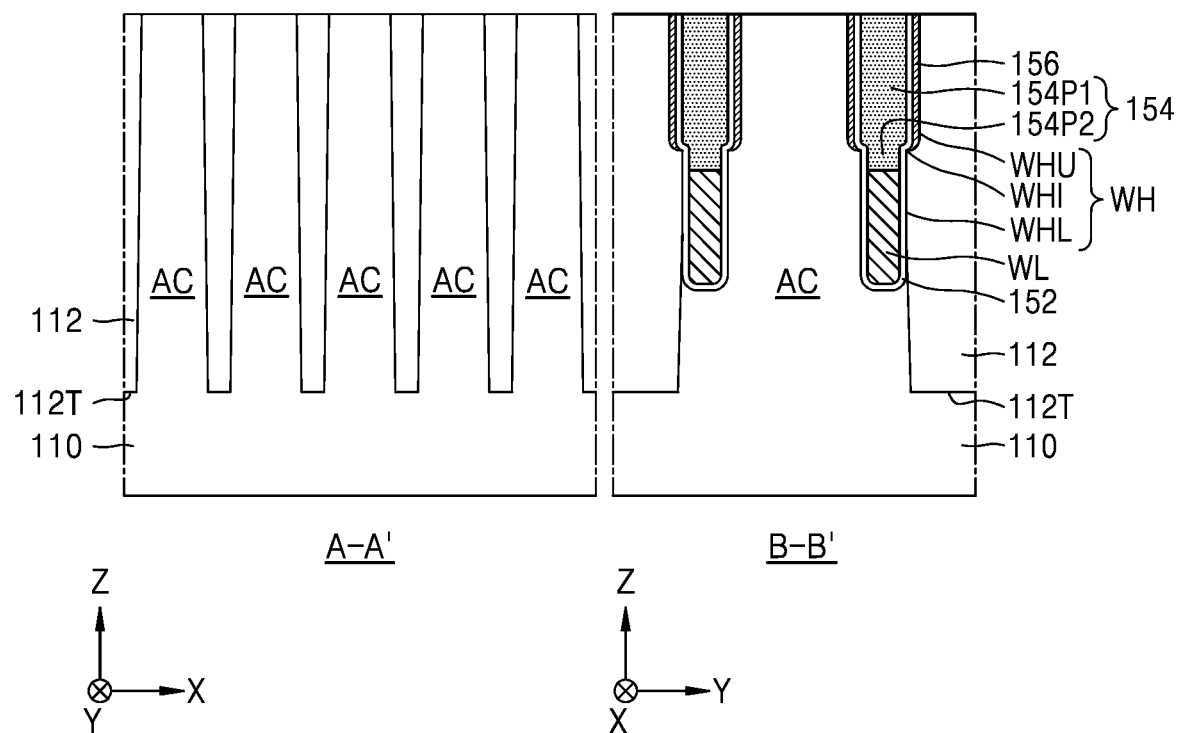

Referring to FIG. 16, a gate capping layer 154 may be formed by forming an insulation layer (not shown) inside the word line trench WH, and by performing a planarization operation on the insulation layer so that the top surface of the substrate 110 is exposed. In the planarization operation, the first hard mask layer 210A may be removed together. Thereafter, a plurality of source/drain regions (not shown) may be formed over the active regions AC by implanting impurity ions to both side portions of the word lines WL in the active regions AC.

Figure 17:
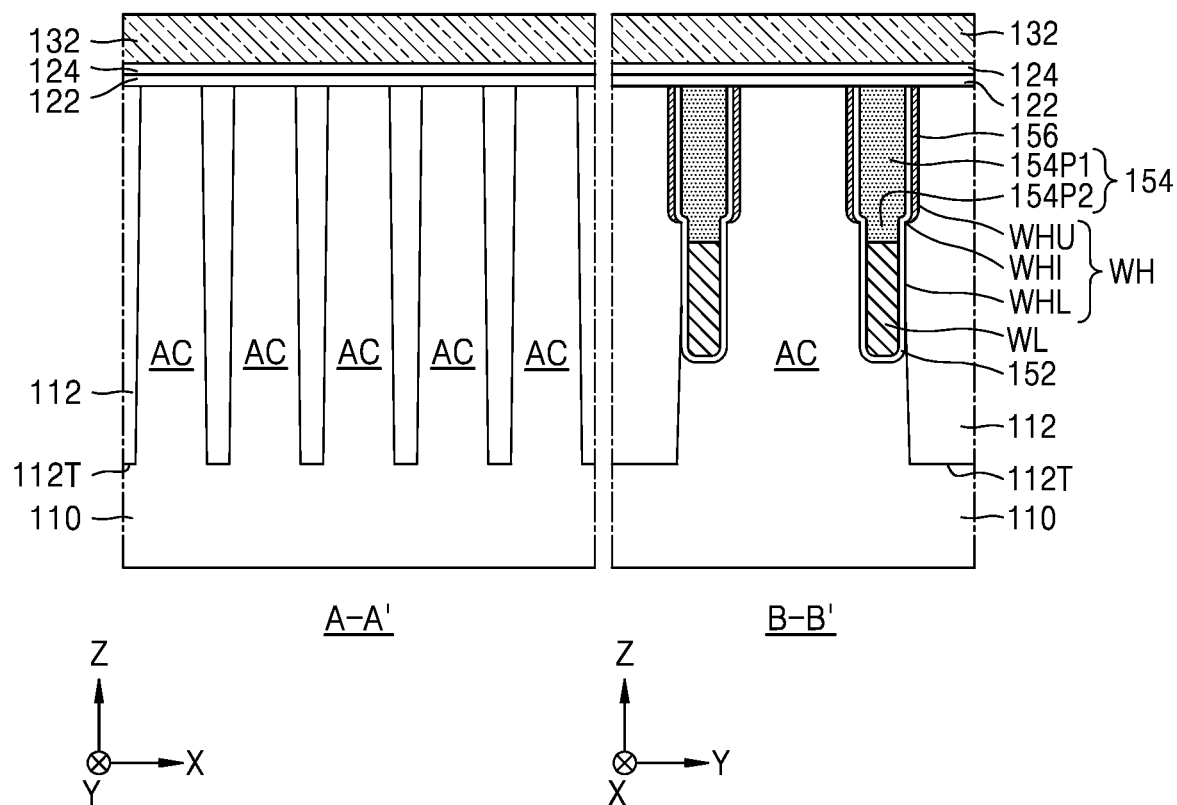

Referring to FIG. 17, a first lower insulation layer 122 and a second lower insulation layer 124 may be formed on the substrate 110, and then a lower conductive layer 132 may be formed on the second lower insulation layer 124. In example embodiments, the lower conductive layer 132 may include Si, Ge, W, WN, Co, Ni, Al, Mo, Ru, Ti, TiN, Ta, TaN, Cu, or a combination thereof. For example, the lower conductive layer 132 may include polysilicon.

Figure 18:
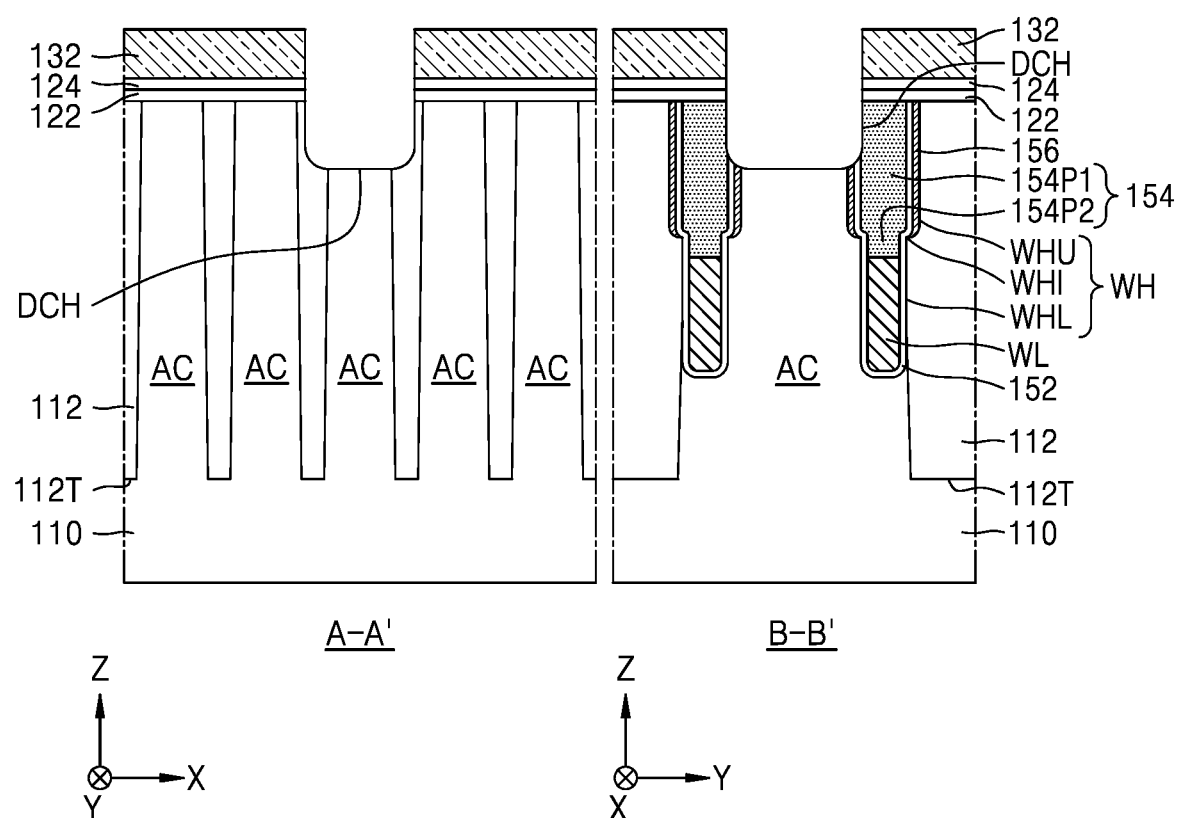

Referring to FIG. 18, direct contact holes DCH exposing the active regions AC of the substrate 110 may be formed by forming a first mask pattern (not shown) on the lower conductive layer 132, etching a portion of the lower conductive layer 132 exposed in an opening (not shown) of the first mask pattern, and etching a portion of the substrate 110 and a portion of the device isolation layer 112 exposed as a result of etching the portion of the lower conductive layer 132.

Figure 19:
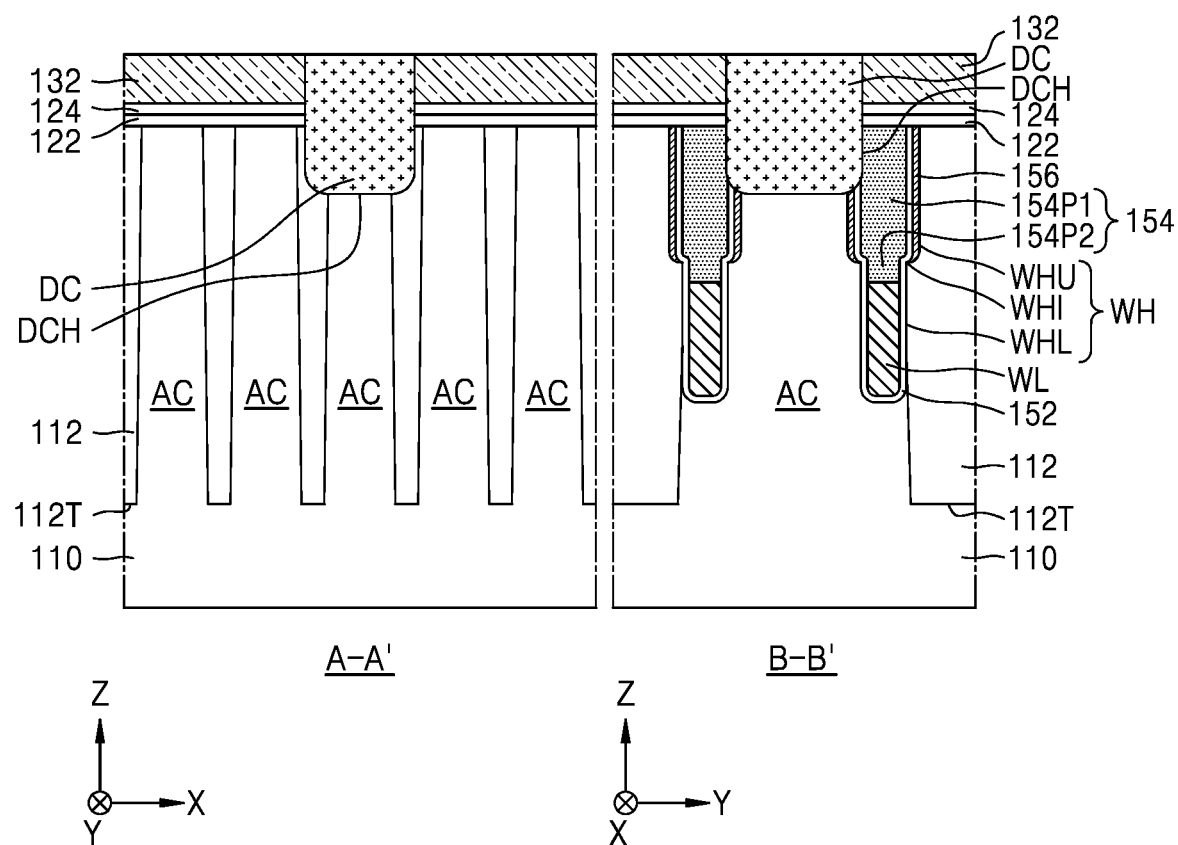

Referring to FIG. 19, the first mask pattern is removed, and direct contacts DC are formed in the direct contact holes DCH. In an example operation for forming the direct contacts DC, a conductive layer having a sufficient thickness to fill the direct contact holes DCH may be formed inside the direct contact holes DCH and on the lower conductive layer 132, and the conductive layer may be etched back, such that the conductive layer only remains inside the direct contact holes DCH. The conductive layer may include polysilicon.

Figure 20:
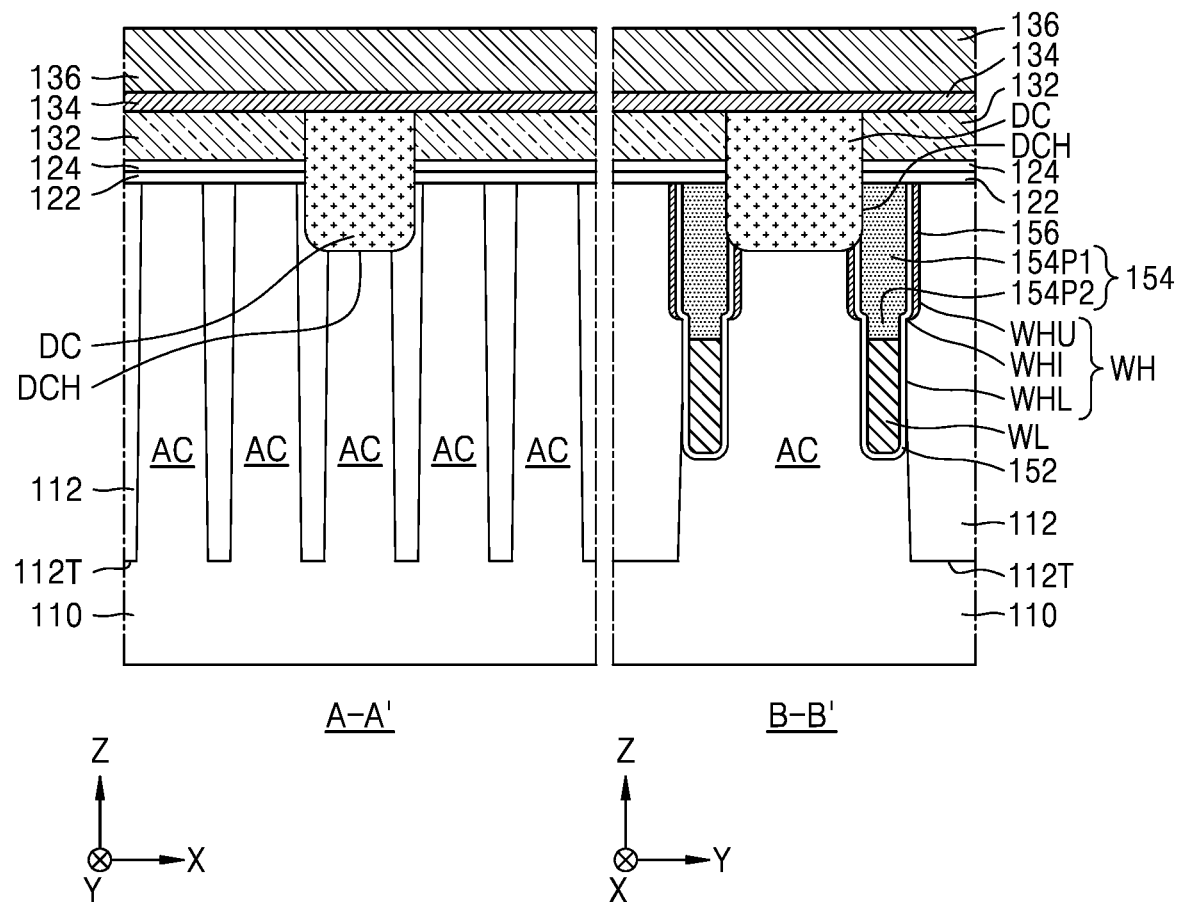

Referring to FIG. 20, an intermediate conductive layer 134 and an upper conductive layer 136 may be sequentially formed on the lower conductive layer 132 and the direct contacts DC. The intermediate conductive layer 134 and the upper conductive layer 136 may each include TiN, TiSiN, W, tungsten silicide, or a combination thereof. In example embodiments, the intermediate conductive layer 134 may include TiN, TiSiN, or a combination thereof, whereas the upper conductive layer 136 may include W.

Figure 21:
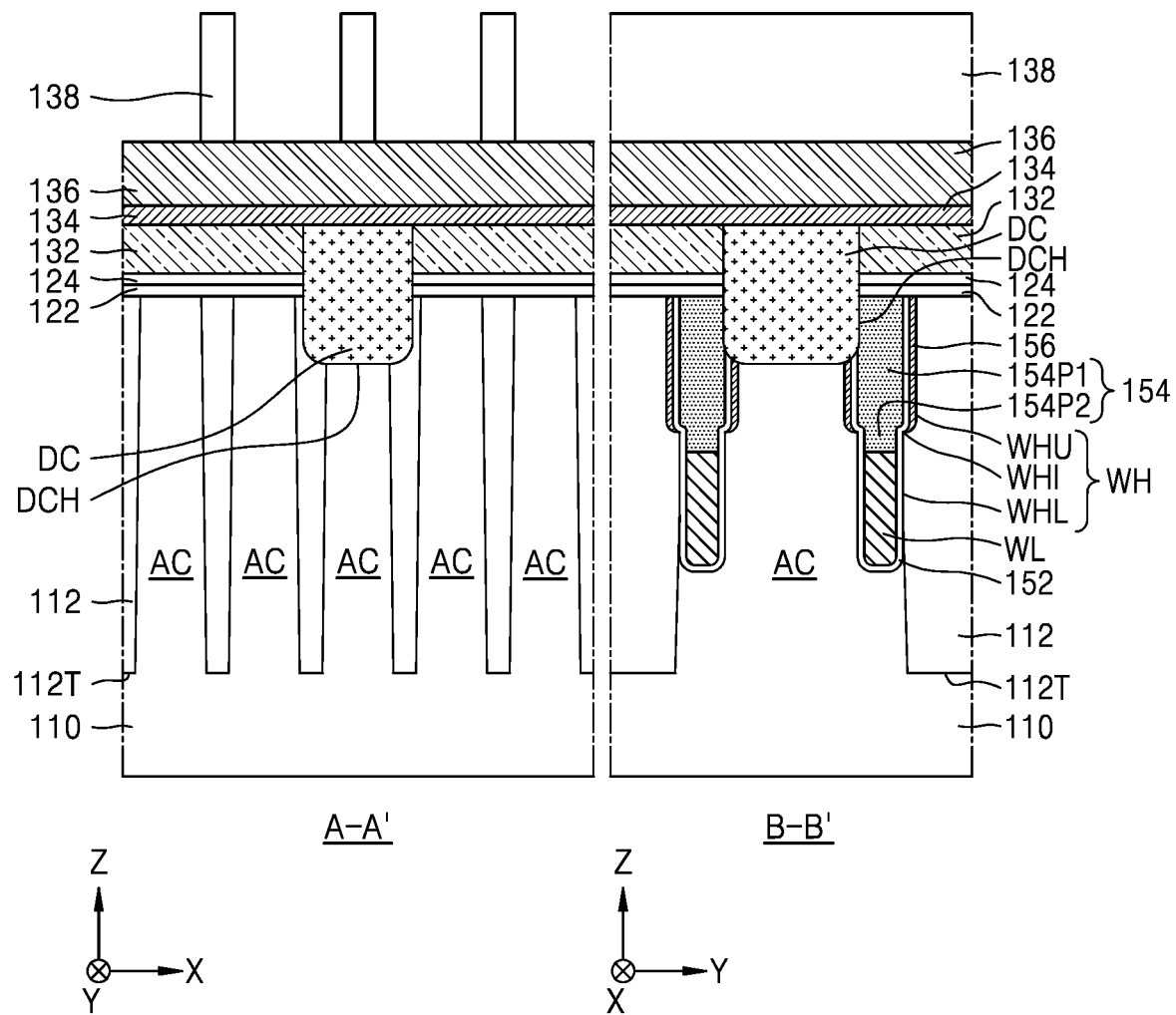

Referring to FIG. 21, a plurality of bit line capping layers 138 extending in the second direction Y may be formed by forming an insulation layer (not shown) on the upper conductive layer 136 and patterning the insulation layer. The bit line capping layers 138 may include silicon nitride films.

Figure 22:
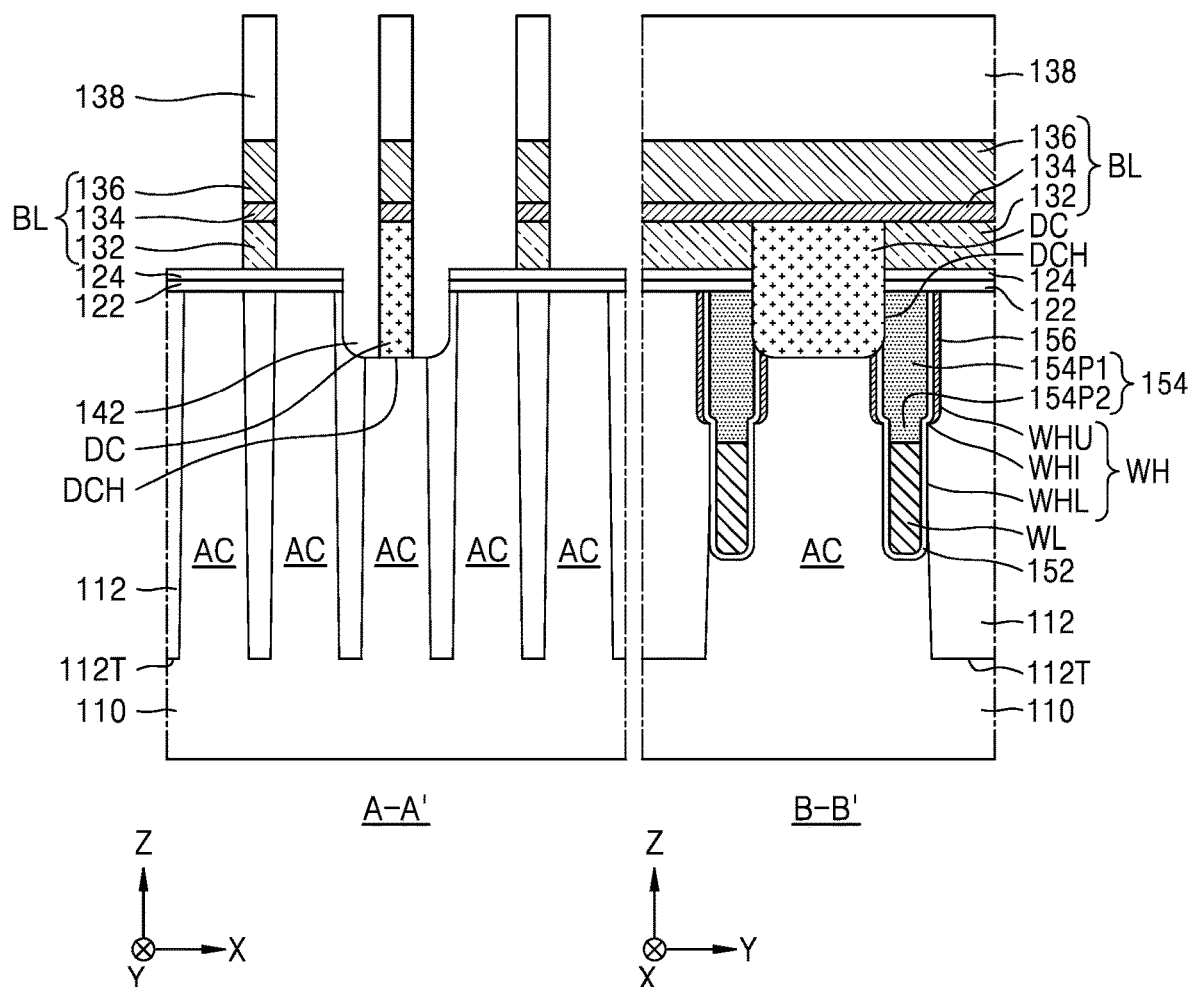

Referring to FIG. 22, the upper conductive layer 136, the intermediate conductive layer 134, and the lower conductive layer 132 may be patterned by using the bit line capping layers 138 as an etching mask. Therefore, the bit lines BL each including the lower conductive layer 132, the intermediate conductive layer 134, and the upper conductive layer 136 are formed. During a process of forming the bit lines BL, portions of the sidewalls of the direct contacts DC may be removed, and the direct contact holes DCH may be partially exposed.

Figure 23:
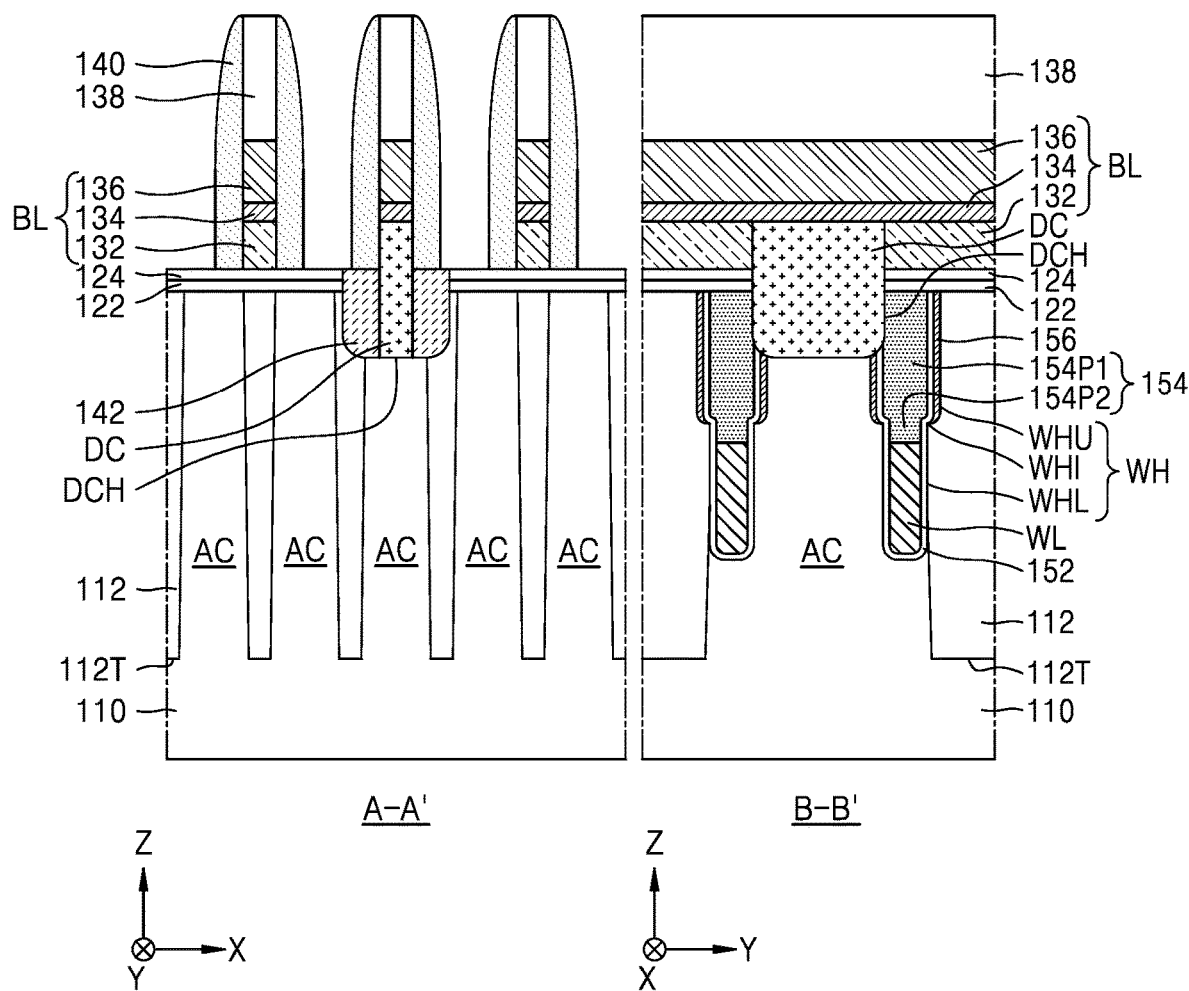

Referring to FIG. 23, direct contact spacers 142 may be formed on the sidewalls of the direct contacts DC, and bit line spacers 140 may be formed on sidewalls of the bit lines BL. In example embodiments, after an insulation layer (not shown) is conformally formed on the sidewalls and the top surfaces of the bit lines BL, an anisotropic etching operation may be performed on the insulation layer, thereby leaving the bit line spacers 140 on the sidewalls of the bit lines BL and leaving the direct contact spacers 142 on the sidewalls of the direct contacts DC. In example embodiments, the bit line spacers 140 and the direct contact spacers 142 may include a silicon nitride.

Figure 24:
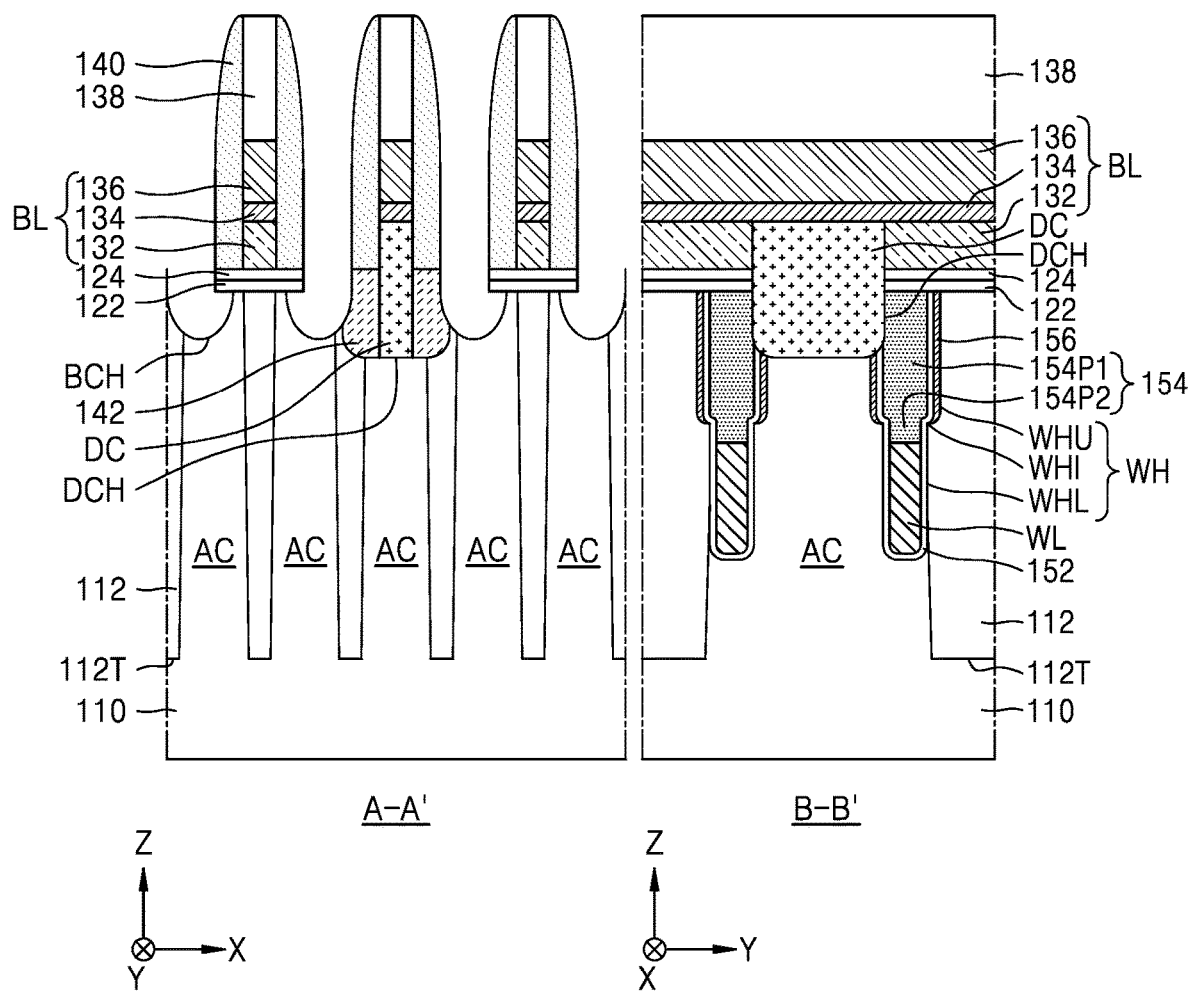

Referring to FIG. 24, a plurality of insulation fences (not shown) may be formed between the bit lines BL. A plurality of buried contact holes BCH exposing the active regions AC of the substrate 110 between the bit lines BL are formed by removing portions of the second lower insulation layer 124, the first lower insulation layer 122, and the substrate 110 exposed in spaces between two adjacent insulation fences from among the insulation fences and between two bit lines BL.

Figure 25:
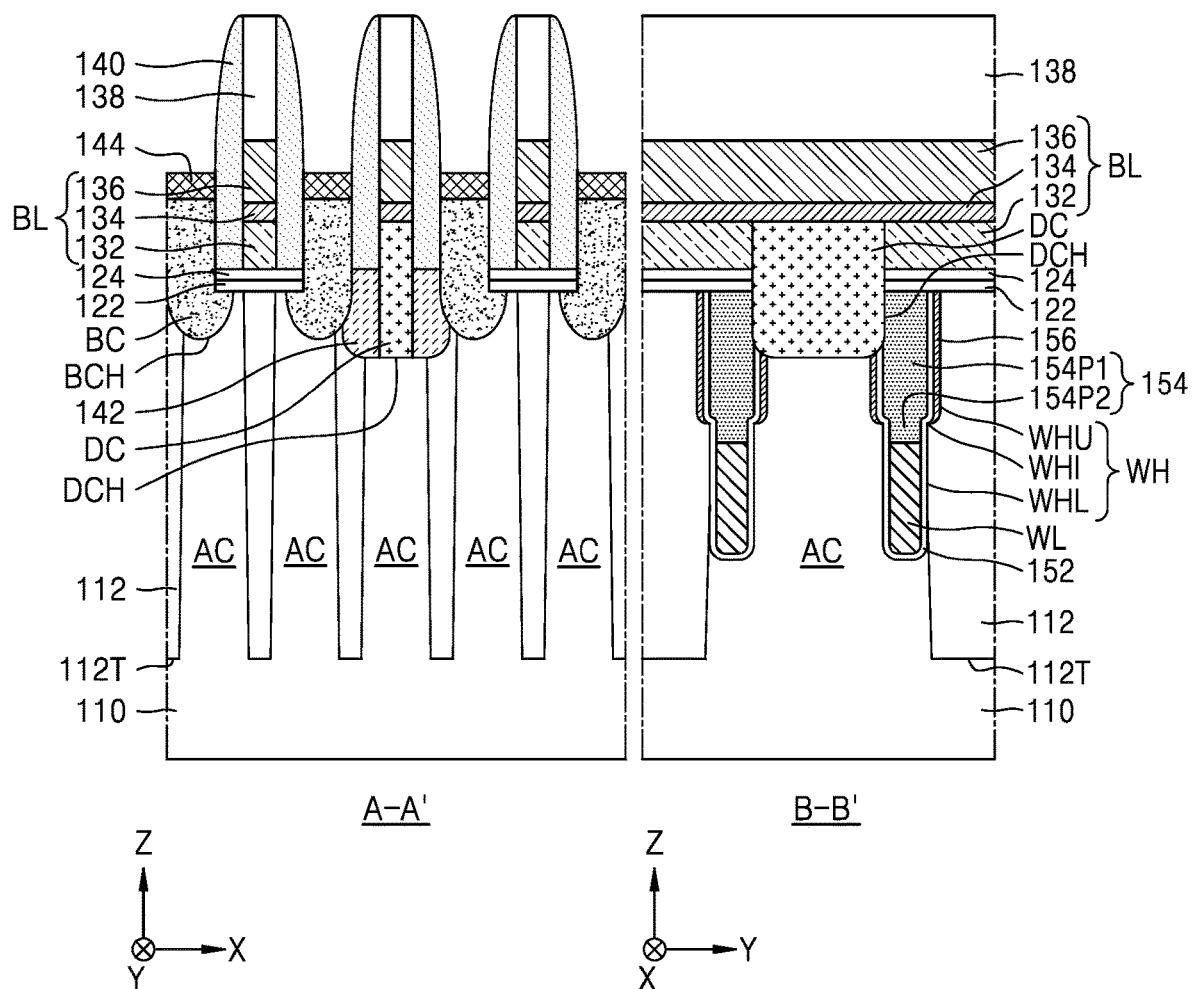

Referring to FIG. 25, a plurality of buried contacts BC filling the buried contact holes BCH between the bit lines BL and filling spaces between the bit lines BL are formed. Thereafter, metal silicide films 144 may be respectively formed on the buried contacts BC.

Figure 26:
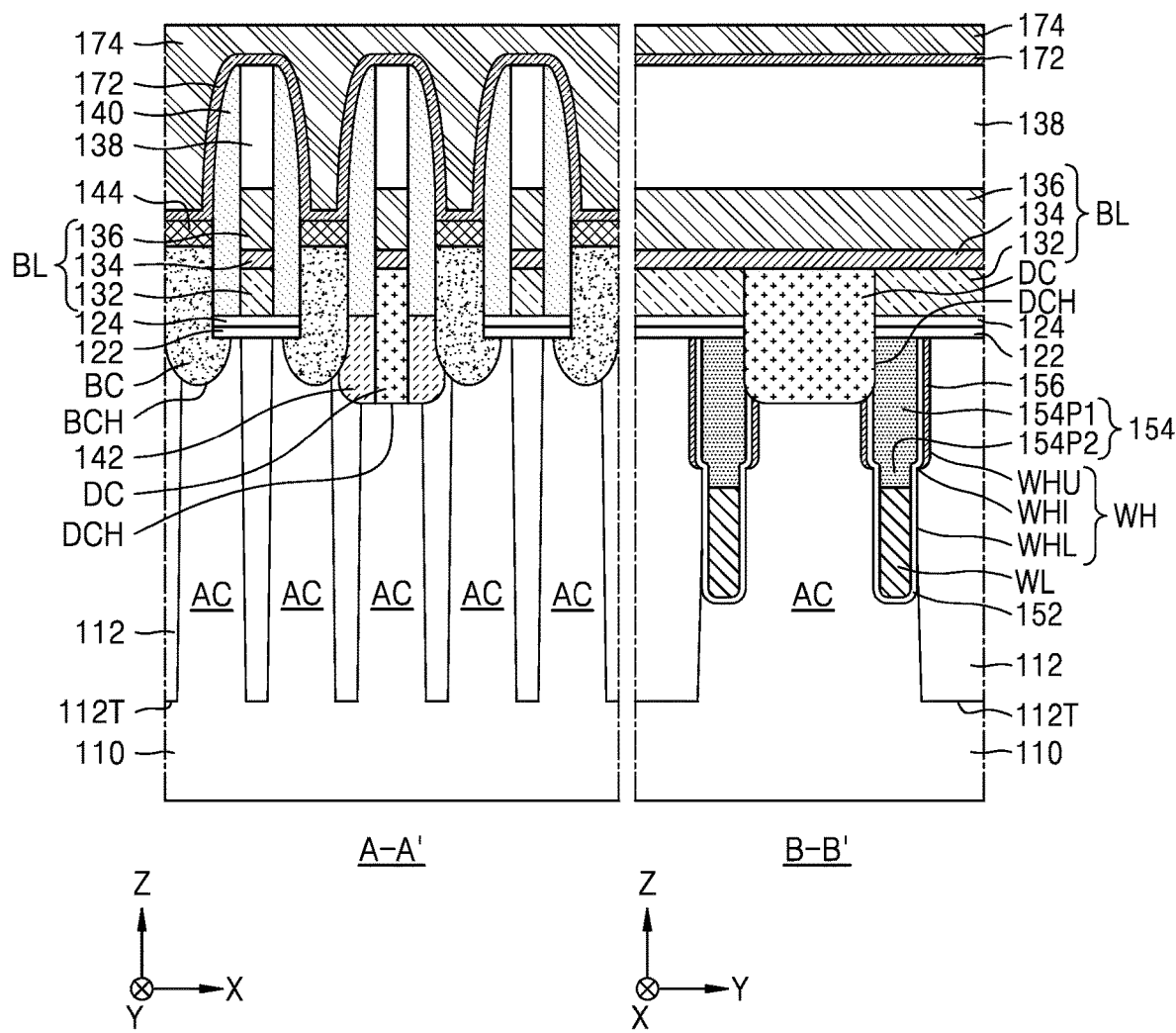

Referring to FIG. 26, a conductive barrier film 172 and a landing pad conductive layer 174 covering exposed surfaces of the result structure are formed on the substrate 110.

Figure 27:
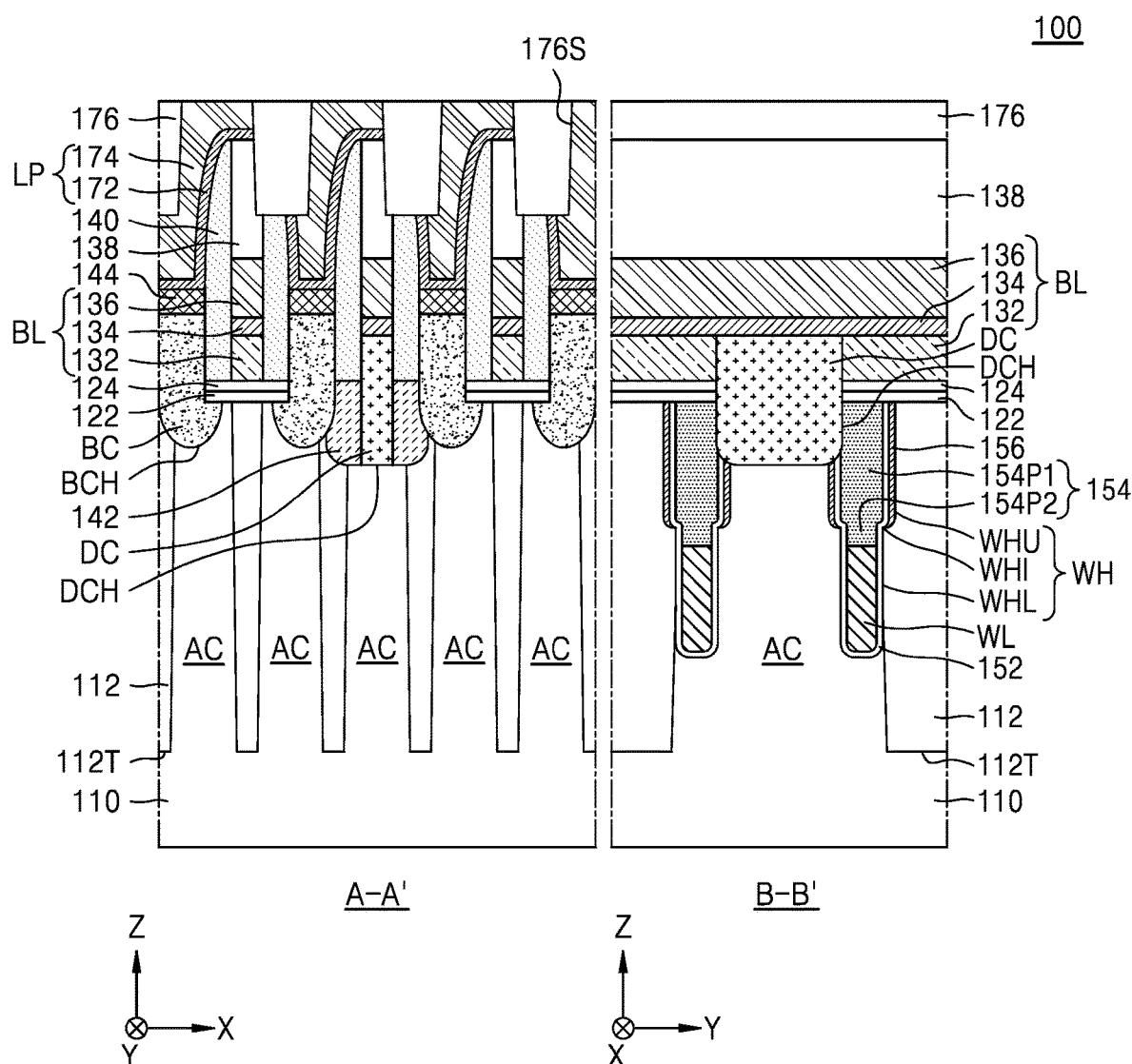

Referring to FIG. 27, a plurality of landing pads LP may be formed by patterning the landing pad conductive layer 174 and the conductive barrier film 172. As shown in FIG. 1, the landing pads LP may have a pattern shape of a plurality of islands in a view from above. The landing pads LP may be formed to vertically overlap portions of the bit lines BL on the metal silicide films 144.

As the landing pads LP are formed to have a pattern shape of a plurality of islands, an insulation space 176S surrounding the landing pads LP may be formed. An insulation pattern 176 may be formed on inner walls of the insulation space 176S by using an insulation material. The insulation pattern 176 may be formed through a spin coating process, a CVD process, a flowable CVD (FCVD) process, etc. Thereafter, capacitor lower electrodes (not shown) may be formed on the landing pads LP.

Generally, as a distance between adjacent word lines is reduced, a problem like a disturbance due to electrical coupling between the adjacent word lines adjacent occurs. When the width of a word line is reduced to prevent a disturbance, the difficulty of a process of forming a metal layer constituting a word line within a relatively narrow word line trench and an etchback process on the upper portion of the metal layer may significantly increase. Therefore, when precise control of an etchback process fails, deviation of heights of word lines becomes relatively large (or a window of heights of word lines becomes larger), and thus, it may be difficult for a plurality of buried channel transistors formed by word lines to have uniform electrical properties.

However, according to the embodiments above, the upper portion WHU of the word line trench WH may be formed with a relatively large width first, and then the lower portion WHL of the word line trench WH may be formed with a width less than that of the upper portion WHU by using the insulation liner 156 as an etching mask. Therefore, due to the relatively large width of the upper portion WHU of the word line trench WH, the difficulty of an etchback process of forming the word line WL may decrease, and the etchback process may be precisely controlled. Furthermore, a sufficiently large distance may be secured between the word lines WL in the lower portion WHL of the word line trench WH, and thus, an electrical coupling or a disturbance may be reduced or prevented. The integrated circuit device 100 as described above may have excellent electrical performance.

FIGS. 28 to 31 are cross-sectional views sequentially showing operations of a method of manufacturing an integrated circuit device according to example embodiments. Referring to FIGS. 28 to 31, a method of manufacturing the integrated circuit device 100C shown in FIG. 6 will be described.

First, the word line trench WH including the upper portion WHU, the lower portion WHL, and the inflection portion WHI may be formed by performing the operations described above with reference to FIGS. 8 to 11. Here, the insulation liner 156 is disposed on the sidewalls of the upper portion WHU and may function as an etching mask for forming the lower portion WHL.

Figure 28:
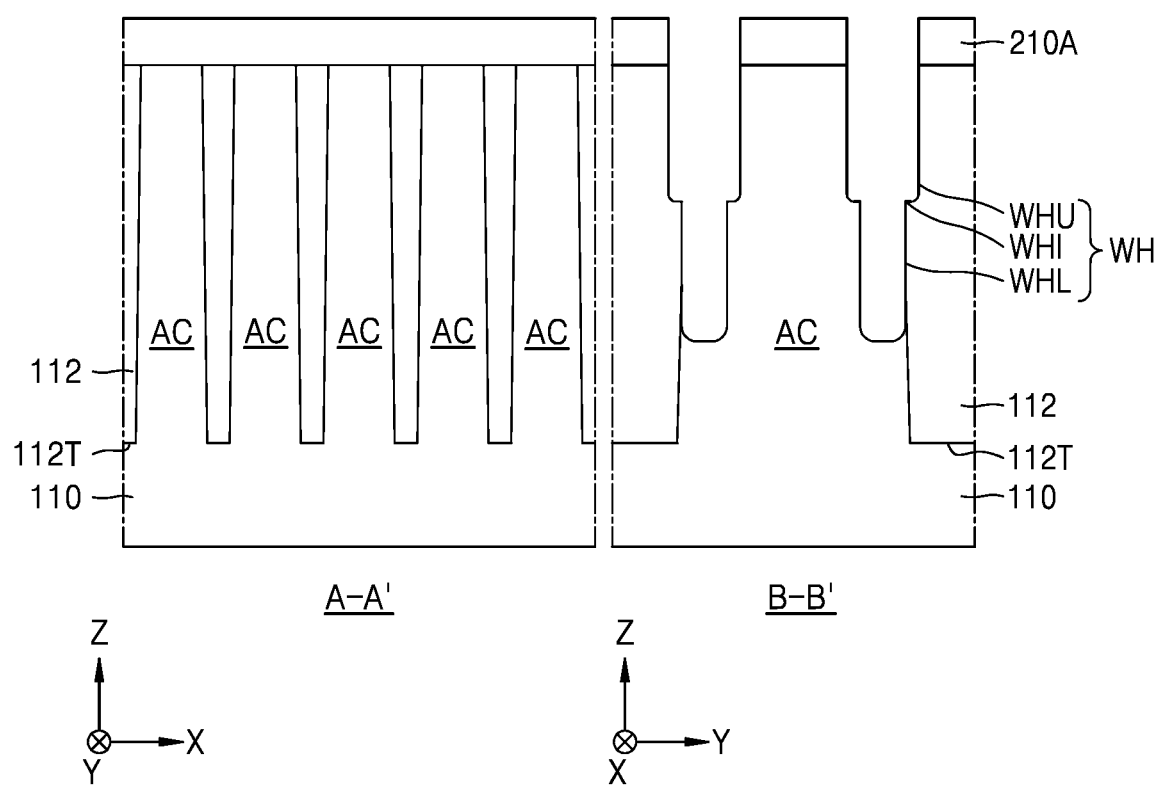
FIGS. 28 to 31 are cross-sectional views sequentially showing operations of a method of manufacturing an integrated circuit device according to example embodiments.

Referring to FIG. 28, a portion of the insulation liner 156 on the sidewalls of the upper portion WHU of the word line trench WH may be removed. Therefore, a portion of the surface of the substrate 110 at the upper portion WHU of the word line trench WH may be exposed again.

Figure 29:
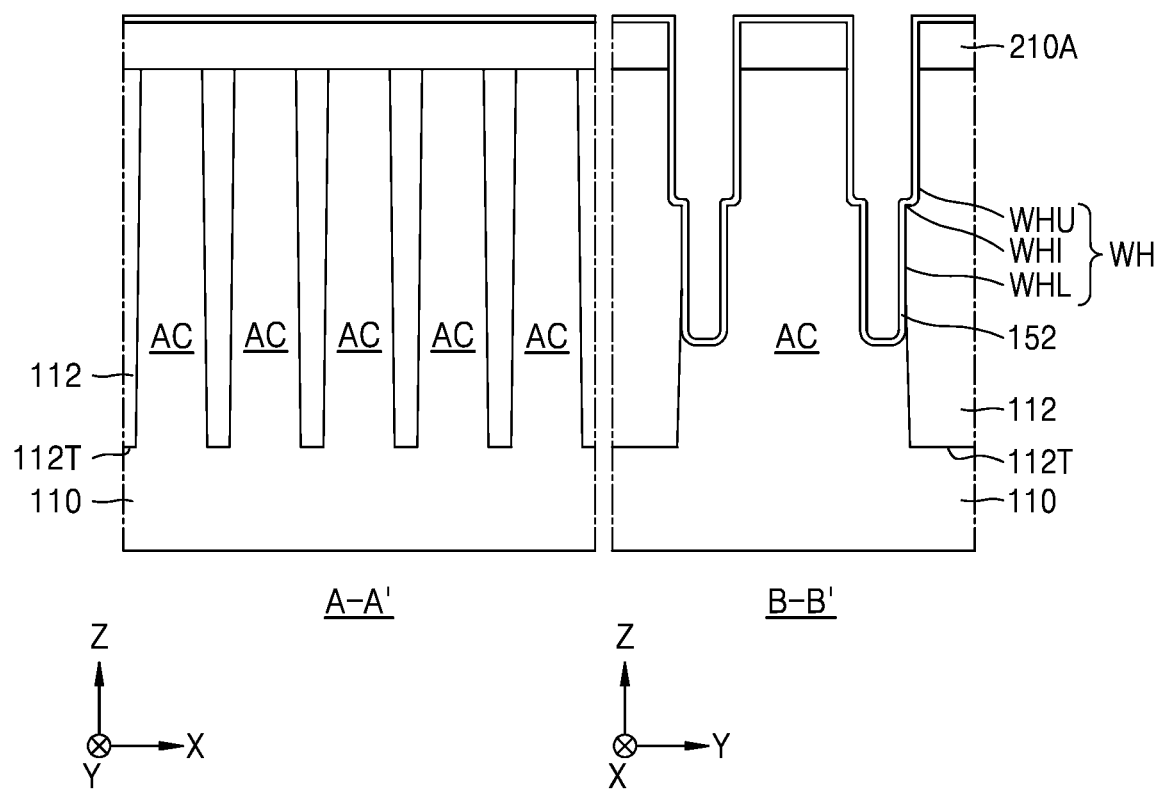

Referring to FIG. 29, gate insulation layers 152 may be formed on the inner walls of the word line trenches WH and on the first hard mask layer 210A. In example embodiments, a gate insulation layer 152 may be conformally arranged on inner walls of the word line trench WH along the upper portion WHU, the inflection portion WHI, and the lower portion WHL of the word line trench WH.

Figure 30:
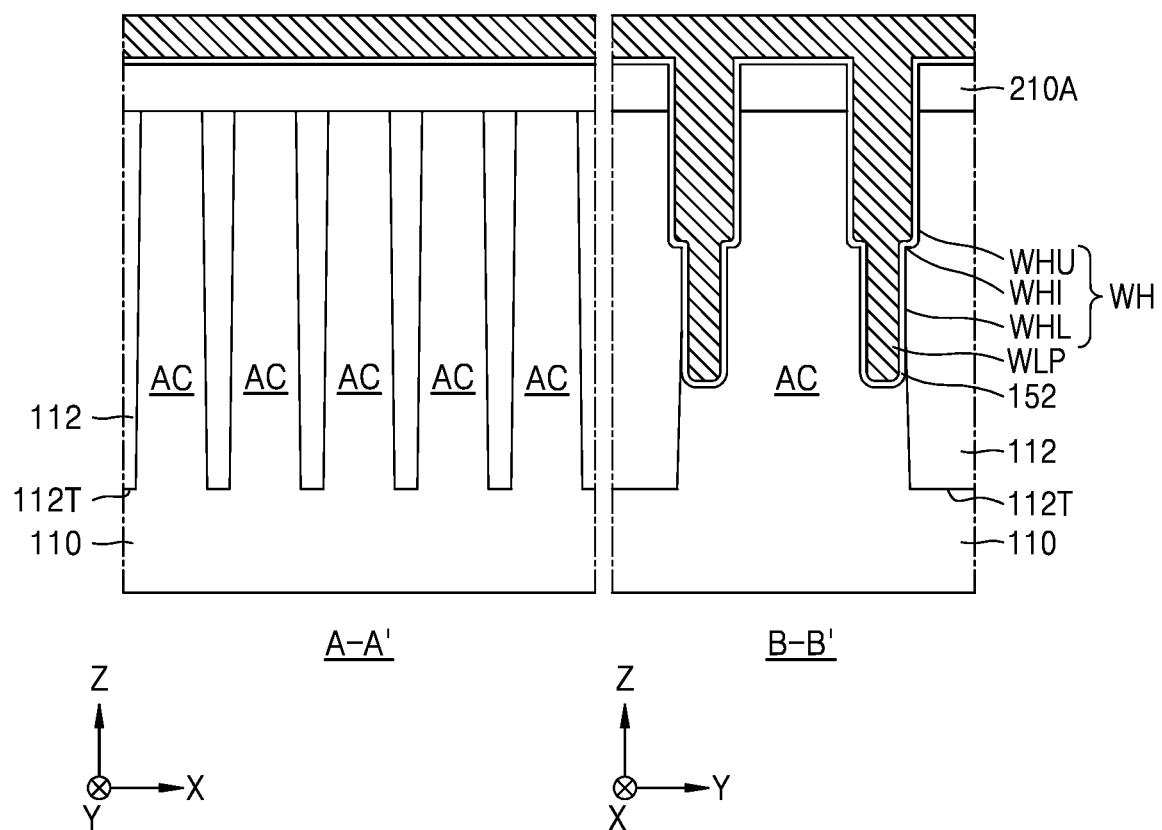

Referring to FIG. 30, a word line metal layer WLP may be formed in the word line trenches WH.

Figure 31:
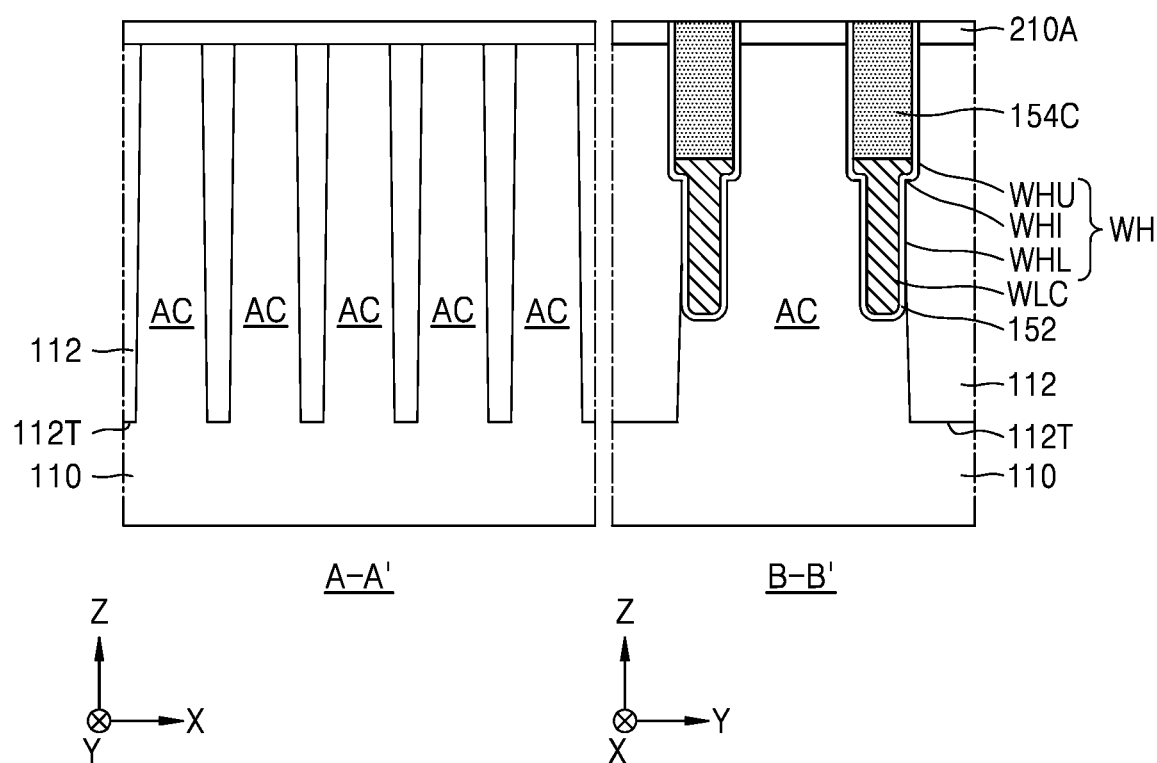

Referring to FIG. 31, a word line WLC may be formed by performing an etchback operation on the word line metal layer WLP (refer to FIG. 30).

In example embodiments, the etchback operation may be performed, such that the word line WLC has the top surface placed at a higher level than the inflection portion WHI. For example, as a portion of the word line metal layer WLP inside the upper portion WHU of the word line trench WH having a relatively large width is removed in etchback operation, the difficulty of the overall etchback operation may be lowered. Therefore, the etchback operation may be precisely controlled. For example, the height of the word line WLC may be adjusted precisely. Thereafter, the integrated circuit device 1000 may be completed by performing the operations described above with reference to FIGS. 16 to 27.

While the inventive concept has been particularly shown and described with reference to embodiments thereof, it will be understood that various changes in form and details may be made therein without departing from the spirit and scope of the following claims.

What is claimed is:

1. An integrated circuit device, comprising:
a substrate comprising an active region;
a word line disposed inside a word line trench formed in the substrate and extending in a first direction parallel to a top surface of the substrate;
a bit line extending on the substrate in a second direction perpendicular to the first direction;
a gate insulation layer disposed on inner walls of the word line trench and surrounding sidewalls and a bottom surface of the word line; and
a gate capping layer disposed inside the word line trench and on the word line,
wherein the word line trench comprises:
a lower portion having a first width in the second direction;
an upper portion disposed at a level higher than that of the lower portion and having a second width greater than the first width of the lower portion in the second direction; and
an inflection portion defined between the lower portion and the upper portion.

2. The integrated circuit device of claim 1, wherein sidewalls of the upper portion extend outward with respect to the lower portion.

3. The integrated circuit device of claim 1, wherein the second width is from about 110% to about 200% of the first width.

4. The integrated circuit device of claim 1, wherein a width of the word line trench varies discontinuously at the inflection portion, and
an inclination of sidewalls of the word line trench varies rapidly at the inflection portion.

5. The integrated circuit device of claim 1, further comprising an insulation liner disposed on inner walls of the upper portion of the word line trench and covering sidewalls of the gate insulation layer.

6. The integrated circuit device of claim 5, wherein a bottom portion of the insulation liner surrounds the inflection portion.

7. The integrated circuit device of claim 5, wherein a bottom surface of the insulation liner is at a level higher than that of a top surface of the word line.

8. The integrated circuit device of claim 5, wherein a bottom surface of the insulation liner is at a level lower than that of a top surface of the word line.

9. The integrated circuit device of claim 1, wherein the gate capping layer comprises:
a first portion disposed inside the upper portion of the word line trench; and
a second portion disposed inside the lower portion of the word line trench, and
a third width of the first portion in the second direction is greater than a fourth width of the second portion in the second direction.

10. The integrated circuit device of claim 1, wherein a top surface of the word line is at a level higher than that of the inflection portion, and
the word line comprises an extended portion protruding in lateral directions at a level higher than that of the inflection portion.

11. An integrated circuit device, comprising:
a substrate comprising an active region;
a word line disposed inside a word line trench formed in the substrate and extending in a first direction parallel to a top surface of the substrate;
a bit line extending on the substrate in a second direction perpendicular to the first direction;

a gate insulation layer disposed on inner walls of the word line trench and surrounding sidewalls and a bottom surface of the word line;

a gate capping layer disposed inside the word line trench and on the word line and comprising an upper portion having a width greater than a width of the word line in the second direction; and an insulation liner disposed on sidewalls of the upper portion of the word line trench and between the gate insulation layer and the substrate.

12. The integrated circuit device of claim 11, wherein the word line trench comprises:

a lower portion having a first width in the second direction;

an upper portion disposed above the lower portion and having a second width greater than the first width in the second direction; and an inflection portion defined between the lower portion and the upper portion.

13. The integrated circuit device of claim 12, wherein a width of the word line trench varies discontinuously at the inflection portion, and wherein sidewalls of the upper portion extend outward with respect to the lower portion.

14. The integrated circuit device of claim 12, wherein a bottom portion of the insulation liner surrounds the inflection portion.

15. The integrated circuit device of claim 12, wherein the insulation liner extends to the inflection portion along inner walls of the upper portion of the word line trench, and a bottom surface of the gate capping layer is at a vertical level lower than that of the inflection portion.

16. The integrated circuit device of claim 15, wherein the gate capping layer comprises:

a first portion disposed inside the upper portion of the word line trench; and a second portion disposed inside the lower portion of the word line trench, and a third width of the first portion in the second direction is greater than a fourth width of the second portion in the second direction.

17. The integrated circuit device of claim 12, wherein a bottom surface of the gate capping layer is at a vertical level higher than that of the inflection portion, and the word line comprises an extended portion protruding in lateral directions at a level higher than that of the inflection portion.

18. An integrated circuit device, comprising:

a substrate comprising an active region;

a word line trench formed in the substrate, extending in a first direction parallel to a top surface of the substrate, and comprising a lower portion having a first width in a second direction perpendicular to the first direction and an upper portion having a second width greater than the first width in the second direction;

a word line disposed inside the word line trench and extending in the first direction;

a gate insulation layer disposed on inner walls of the word line trench and surrounding sidewalls and a bottom surface of the word line;

a gate capping layer disposed on inner walls of the word line trench and on the word line;

an insulation liner disposed on the upper portion of the word line trench and between the gate insulation layer and the substrate;

a bit line extending in the second direction on the substrate; and a direct contact disposed between the active region of the substrate and the bit line.

19. The integrated circuit device of claim 18, wherein the gate capping layer comprises:

a first portion disposed inside the upper portion of the word line trench; and a second portion disposed inside the lower portion of the word line trench, and a third width of the first portion in the second direction is greater than a fourth width of the second portion in the second direction.

20. The integrated circuit device of claim 18, wherein the word line trench further comprises an inflection portion defined between the upper portion and the lower portion, the insulation liner extends to the inflection portion along inner walls of the upper portion of the word line trench, and a bottom surface of the gate capping layer is at a vertical level lower than that of the inflection portion.

* * * * *